United States Patent
Sglavo et al.

(10) Patent No.: US 10,560,313 B2
(45) Date of Patent: Feb. 11, 2020

(54) PIPELINE SYSTEM FOR TIME-SERIES DATA FORECASTING

(71) Applicant: SAS Institute Inc., Cary, NC (US)

(72) Inventors: Udo Vincenzo Sglavo, Raleigh, NC (US); Phillip Mark Helmkamp, Apex, NC (US); Jerzy Michal Brzezicki, Cary, NC (US); Timothy Patrick Haley, Cary, NC (US); Sujatha Pothireddy, Apex, NC (US)

(73) Assignee: SAS INSTITUTE INC., Cary, NC (US)

( * ) Notice: Subject to any disclaimer, the term of this patent is extended or adjusted under 35 U.S.C. 154(b) by 0 days.

(21) Appl. No.: 16/452,791

(22) Filed: Jun. 26, 2019

(65) Prior Publication Data

US 2019/0394083 A1    Dec. 26, 2019

Related U.S. Application Data

(60) Provisional application No. 62/866,595, filed on Jun. 25, 2019, provisional application No. 62/700,966, (Continued)

(30) Foreign Application Priority Data

Jul. 16, 2018 (IN) .............................. 201811026489

(51) Int. Cl.
*H04L 12/24* (2006.01)
*G06F 11/34* (2006.01)
(Continued)

(52) U.S. Cl.
CPC ...... *H04L 41/0663* (2013.01); *H04L 41/0668* (2013.01); *H04L 41/0686* (2013.01); (Continued)

(58) Field of Classification Search
CPC ........ H04L 41/16; G06N 20/00; G06N 7/005; G06N 3/08; G06N 3/0472; G06N 5/022; (Continued)

(56) References Cited

U.S. PATENT DOCUMENTS

| | | | |
|---|---|---|---|
| 4,947,363 A | 8/1990 | Williams | |
| 5,001,661 A | 3/1991 | Corleto et al. | |

(Continued)

FOREIGN PATENT DOCUMENTS

| | | |
|---|---|---|
| WO | 01/15079 | 3/2001 |
| WO | 2014/099216 | 6/2014 |
| WO | 2018/075400 | 4/2018 |

OTHER PUBLICATIONS

Alali, N. et al., "Neural network meta-modeling of steam assisted gravity drainage oil recover process" Iranaian Journal of Chemistry and Chemical Engineering (IJCCE) vol. 29. No. 3, 2010, pp. 109-122.

(Continued)

*Primary Examiner* — Ricardo H Castaneyra
(74) *Attorney, Agent, or Firm* — Kilpatrick Townsend & Stockton LLP

(57) ABSTRACT

A pipeline system for time-series data forecasting using a distributed computing environment is disclosed herein. In one example, a pipeline for forecasting time series is generated. The pipeline represents a sequence of operations for processing the time series to produce forecasts. The sequence of operations include model strategy operations for applying various model strategies to the time series to determine error distributions corresponding to the model strategies. The sequence of operations further include a model-strategy comparison operation for determining which of the model strategies is a champion model strategy for the plurality of time series based on the error distributions of the (Continued)

model strategies. The pipeline is executed to determine the champion model strategy for the time series.

30 Claims, 19 Drawing Sheets

Related U.S. Application Data filed on Jul. 20, 2018, provisional application No. 62/690,169, filed on Jun. 26, 2018.

(51) Int. Cl.
    *G06F 17/18*     (2006.01)
    *G06F 17/50*     (2006.01)
    *G06N 20/00*     (2019.01)
    *G06N 7/00*     (2006.01)
    *G06N 5/04*     (2006.01)

(52) U.S. Cl.
    CPC .............. *H04L 41/12* (2013.01); *H04L 41/16* (2013.01); *H04L 41/22* (2013.01); *G06F 11/3447* (2013.01); *G06F 11/3452* (2013.01); *G06F 17/18* (2013.01); *G06F 17/5009* (2013.01); *G06N 5/04* (2013.01); *G06N 7/005* (2013.01); *G06N 20/00* (2019.01)

(58) Field of Classification Search
    CPC ...... G06N 5/025; G06N 5/04; G06Q 30/0202; G06Q 10/04; G06Q 10/0639; G06Q 10/06395; G06F 17/18; G06F 2217/10; G06F 2217/34; G06F 11/0709; G06F 11/0751
See application file for complete search history.

(56) References Cited

U.S. PATENT DOCUMENTS

| | | |
|---|---|---|
| 5,461,699 A | 10/1995 | Arbabi et al. |
| 5,559,895 A | 9/1996 | Lee et al. |
| 5,661,735 A | 8/1997 | Fischer |
| 5,870,746 A | 2/1999 | Knutson et al. |
| 5,926,822 A | 7/1999 | Garman |
| 6,052,481 A | 4/2000 | Grajski et al. |
| 6,151,582 A | 11/2000 | Huang et al. |
| 6,223,173 B1 | 4/2001 | Wakio et al. |
| 6,230,064 B1 | 5/2001 | Nakase et al. |
| 6,317,731 B1 | 11/2001 | Luciano |
| 6,356,842 B1 | 3/2002 | Intriligator et al. |
| 6,397,166 B1 | 5/2002 | Leung et al. |
| 6,400,853 B1 | 6/2002 | Shiiyama |
| 6,532,467 B1 | 3/2003 | Brocklebank |
| 6,539,392 B1 | 3/2003 | Rebane |
| 6,542,869 B1 | 4/2003 | Foote |
| 6,570,592 B1 | 5/2003 | Sajdak et al. |
| 6,591,255 B1 | 7/2003 | Tatum et al. |
| 6,609,085 B1 | 8/2003 | Uemura et al. |
| 6,611,726 B1 | 8/2003 | Crosswhite |
| 6,662,185 B1 | 12/2003 | Stark et al. |
| 6,735,738 B1 | 5/2004 | Kojima |
| 6,745,150 B1 | 6/2004 | Breiman |
| 6,748,374 B1 | 6/2004 | Madan et al. |
| 6,775,646 B1 | 8/2004 | Tufillaro et al. |
| 6,792,399 B1 | 9/2004 | Phillips et al. |
| 6,850,871 B1 | 2/2005 | Barford et al. |
| 6,876,988 B2 | 4/2005 | Helsper et al. |
| 6,928,398 B1 | 8/2005 | Fang et al. |
| 6,928,433 B2 | 8/2005 | Goodman et al. |
| 6,941,289 B2 | 9/2005 | Goodnight et al. |
| 6,978,249 B1 | 12/2005 | Beyer et al. |
| 7,072,863 B1 | 7/2006 | Phillips et al. |
| 7,127,466 B2 | 10/2006 | Brocklebank et al. |
| 7,130,822 B1 | 10/2006 | Their et al. |
| 7,162,461 B2 | 1/2007 | Goodnight et al. |
| 7,171,340 B2 | 1/2007 | Brocklebank |
| 7,194,434 B2 | 3/2007 | Piccioli |
| 7,216,088 B1 | 5/2007 | Chappel et al. |
| 7,222,082 B1 | 5/2007 | Adhikari et al. |
| 7,236,940 B2 | 6/2007 | Chappel |
| 7,251,589 B1 | 7/2007 | Crowe et al. |
| 7,260,550 B1 | 8/2007 | Notani |
| 7,280,986 B2 | 10/2007 | Goldberg et al. |
| 7,340,440 B2 | 3/2008 | Goodnight et al. |
| 7,433,809 B1 | 10/2008 | Guirguis |
| 7,433,834 B2 | 10/2008 | Joao |
| 7,454,420 B2 | 11/2008 | Ray et al. |
| 7,523,048 B1 | 4/2009 | Dvorak |
| 7,530,025 B2 | 5/2009 | Ramarajan et al. |
| 7,562,062 B2 | 7/2009 | Ladde et al. |
| 7,565,417 B2 | 7/2009 | Rowady, Jr. |
| 7,570,262 B2 | 8/2009 | Landau et al. |
| 7,610,214 B1 | 10/2009 | Dwarakanath et al. |
| 7,617,167 B2 | 11/2009 | Griffis et al. |
| 7,624,054 B2 | 11/2009 | Chen et al. |
| 7,624,114 B2 | 11/2009 | Paulus et al. |
| 7,634,423 B2 | 12/2009 | Brocklebank |
| 7,664,618 B2 | 2/2010 | Cheung et al. |
| 7,693,737 B2 | 4/2010 | Their et al. |
| 7,702,482 B2 | 4/2010 | Graepel et al. |
| 7,707,091 B1 | 4/2010 | Kauffman et al. |
| 7,711,734 B2 | 5/2010 | Leonard et al. |
| 7,716,022 B1 | 5/2010 | Park et al. |
| 7,774,179 B2 | 8/2010 | Guirguis |
| 7,788,127 B2 | 8/2010 | Gilgur et al. |
| 7,788,195 B1 | 8/2010 | Subramanian et al. |
| 7,912,773 B1 | 3/2011 | Subramanian et al. |
| 7,930,200 B1 | 4/2011 | McGuirk et al. |
| 7,941,413 B2 | 5/2011 | Kashiyama et al. |
| 7,987,106 B1 | 7/2011 | Aykin |
| 8,000,994 B2 | 8/2011 | Brocklebank |
| 8,005,707 B1 | 8/2011 | Jackson et al. |
| 8,010,324 B1 | 8/2011 | Crowe et al. |
| 8,014,983 B2 | 9/2011 | Crowe et al. |
| 8,024,241 B2 | 9/2011 | Bailey et al. |
| 8,065,132 B2 | 11/2011 | Chen et al. |
| 8,065,203 B1 | 11/2011 | Chien et al. |
| 8,108,243 B2 | 1/2012 | Solotorevsky et al. |
| 8,112,302 B1 | 2/2012 | Trovero et al. |
| 8,200,518 B2 | 6/2012 | Bailey et al. |
| 8,306,788 B2 | 11/2012 | Chen et al. |
| 8,326,677 B1 | 12/2012 | Fan et al. |
| 8,352,215 B2 | 1/2013 | Chen et al. |
| 8,364,517 B2 | 1/2013 | Trovero et al. |
| 8,374,903 B2 | 2/2013 | Little |
| 8,489,622 B2 | 7/2013 | Joshi et al. |
| 8,619,955 B2 | 12/2013 | Gopalakrishnan et al. |
| 8,631,040 B2 | 1/2014 | Jackson et al. |
| 8,645,421 B2 | 2/2014 | Meric et al. |
| 8,676,629 B2 | 3/2014 | Chien et al. |
| 8,805,737 B1 | 8/2014 | Chen et al. |
| 8,824,649 B2 | 9/2014 | Gopalakrishnan et al. |
| 8,935,198 B1 | 1/2015 | Phillips et al. |
| 9,037,998 B2 | 5/2015 | Leonard et al. |
| 9,047,559 B2 | 6/2015 | Brzezicki et al. |
| 9,087,306 B2 | 7/2015 | Leonard et al. |
| 9,116,985 B2 | 8/2015 | Mills et al. |
| 9,141,936 B2 | 9/2015 | Chen et al. |
| 9,147,218 B2 | 9/2015 | Leonard et al. |
| 9,208,209 B1 | 12/2015 | Katz |
| 9,239,854 B2 | 1/2016 | Rausch et al. |
| 9,244,887 B2 | 1/2016 | Leonard et al. |
| 9,323,863 B2 | 4/2016 | Krajec et al. |
| 9,342,904 B2 | 5/2016 | Rubin et al. |
| 9,348,900 B2 | 5/2016 | Alkov et al. |
| 9,418,339 B1 | 8/2016 | Leonard et al. |
| 9,507,833 B2 | 11/2016 | Guirguis et al. |
| 9,524,471 B2 | 12/2016 | Narisetty et al. |
| 9,684,538 B1 | 6/2017 | Liu et al. |
| 9,685,977 B1 | 6/2017 | Takemoto |
| 9,697,099 B2 | 7/2017 | Dubbels et al. |
| 9,703,852 B2 | 7/2017 | Blanc et al. |
| 9,804,726 B1 | 10/2017 | Joos et al. |
| 9,818,063 B2 | 11/2017 | Joshi et al. |

(56) References Cited

U.S. PATENT DOCUMENTS

| | | |
|---|---|---|
| 9,916,282 B2 | 3/2018 | Leonard et al. |
| 9,934,259 B2 | 4/2018 | Leonard et al. |
| 9,940,169 B2 | 4/2018 | Moudy et al. |
| 9,996,798 B2 * | 6/2018 | Pan .................... G08G 1/00 |
| 10,025,753 B2 | 7/2018 | Leonard et al. |
| 10,037,305 B2 | 7/2018 | Leonard et al. |
| 10,061,621 B1 | 8/2018 | Chen et al. |
| 10,082,774 B2 | 9/2018 | Leonard et al. |
| 10,169,709 B2 | 1/2019 | Joshi et al. |
| 10,169,720 B2 | 1/2019 | Chien et al. |
| 10,331,490 B2 | 6/2019 | Leonard et al. |
| 10,338,994 B1 | 7/2019 | Xie et al. |
| 10,366,117 B2 | 7/2019 | Mills et al. |
| 10,372,734 B2 | 8/2019 | Trovero et al. |
| 2001/0013008 A1 | 8/2001 | Waclawski |
| 2002/0052758 A1 | 5/2002 | Arthur et al. |
| 2002/0091605 A1 | 7/2002 | Labe, Jr. et al. |
| 2002/0169657 A1 | 11/2002 | Singh et al. |
| 2002/0169658 A1 | 11/2002 | Adler |
| 2003/0014378 A1 | 1/2003 | Goodnight et al. |
| 2003/0078936 A1 | 4/2003 | Brocklebank et al. |
| 2003/0093709 A1 | 5/2003 | Ogawa et al. |
| 2003/0101009 A1 | 5/2003 | Seem |
| 2003/0105660 A1 | 6/2003 | Walsh et al. |
| 2003/0110016 A1 | 6/2003 | Stefek et al. |
| 2003/0149571 A1 | 8/2003 | Francesco et al. |
| 2003/0154144 A1 | 8/2003 | Pokorny et al. |
| 2003/0172062 A1 | 9/2003 | Brocklebank et al. |
| 2003/0187719 A1 | 10/2003 | Brocklebank |
| 2003/0200134 A1 | 10/2003 | Leonard et al. |
| 2003/0212590 A1 | 11/2003 | Klingler |
| 2004/0003042 A1 | 1/2004 | Horvitz et al. |
| 2004/0030667 A1 | 2/2004 | Xu et al. |
| 2004/0041727 A1 | 3/2004 | Ishii et al. |
| 2004/0172225 A1 | 9/2004 | Hochberg et al. |
| 2005/0102107 A1 | 5/2005 | Porikli |
| 2005/0114391 A1 | 5/2005 | Corcoran et al. |
| 2005/0119922 A1 | 6/2005 | Eder |
| 2005/0159997 A1 | 7/2005 | John |
| 2005/0177351 A1 | 8/2005 | Goldberg et al. |
| 2005/0209732 A1 | 9/2005 | Audimoolam et al. |
| 2005/0249412 A1 | 11/2005 | Radhakrishnan et al. |
| 2005/0271156 A1 | 12/2005 | Nakano |
| 2006/0010089 A1 | 1/2006 | Goodnight et al. |
| 2006/0041403 A1 | 2/2006 | Jaber |
| 2006/0063156 A1 | 3/2006 | Willman et al. |
| 2006/0064181 A1 | 3/2006 | Kato |
| 2006/0085380 A1 | 4/2006 | Cote et al. |
| 2006/0101086 A1 | 5/2006 | Ray et al. |
| 2006/0102858 A1 | 5/2006 | Fujii et al. |
| 2006/0106530 A1 | 5/2006 | Horvitz et al. |
| 2006/0112028 A1 | 5/2006 | Xiao et al. |
| 2006/0143081 A1 | 6/2006 | Argaiz |
| 2006/0164997 A1 | 7/2006 | Graepel et al. |
| 2006/0178927 A1 | 8/2006 | Liao |
| 2006/0241923 A1 | 10/2006 | Xu et al. |
| 2006/0247859 A1 | 11/2006 | Ladde et al. |
| 2006/0247900 A1 | 11/2006 | Brocklebank |
| 2006/0253790 A1 | 11/2006 | Ramarajan et al. |
| 2007/0011175 A1 | 1/2007 | Langseth et al. |
| 2007/0050282 A1 | 3/2007 | Chen et al. |
| 2007/0055604 A1 | 3/2007 | Their et al. |
| 2007/0094176 A1 | 4/2007 | Goodnight et al. |
| 2007/0106550 A1 | 5/2007 | Umblijs et al. |
| 2007/0118491 A1 | 5/2007 | Baum et al. |
| 2007/0129912 A1 | 6/2007 | Inoue et al. |
| 2007/0162301 A1 | 7/2007 | Sussman et al. |
| 2007/0203768 A1 | 8/2007 | Adra |
| 2007/0208492 A1 | 9/2007 | Downs et al. |
| 2007/0208608 A1 | 9/2007 | Amerasinghe et al. |
| 2007/0239753 A1 | 10/2007 | Leonard |
| 2007/0291958 A1 | 12/2007 | Jehan |
| 2008/0004922 A1 | 1/2008 | Eder |
| 2008/0040202 A1 | 2/2008 | Walser et al. |
| 2008/0071588 A1 | 3/2008 | Eder |
| 2008/0097802 A1 | 4/2008 | Ladde et al. |
| 2008/0183786 A1 | 7/2008 | Shimizu |
| 2008/0208832 A1 | 8/2008 | Friedlander et al. |
| 2008/0221949 A1 | 9/2008 | Delurgio et al. |
| 2008/0255924 A1 | 10/2008 | Chien et al. |
| 2008/0270363 A1 | 10/2008 | Hunt et al. |
| 2008/0288537 A1 | 11/2008 | Golovchinsky et al. |
| 2008/0288889 A1 | 11/2008 | Hunt et al. |
| 2008/0294651 A1 | 11/2008 | Masuyama et al. |
| 2008/0319811 A1 | 12/2008 | Casey |
| 2009/0018880 A1 | 1/2009 | Bailey et al. |
| 2009/0018996 A1 | 1/2009 | Hunt et al. |
| 2009/0030662 A1 | 1/2009 | Guirguis |
| 2009/0099879 A1 | 4/2009 | Ouimet |
| 2009/0172035 A1 | 7/2009 | Lessing et al. |
| 2009/0192855 A1 | 7/2009 | Subramanian et al. |
| 2009/0192957 A1 | 7/2009 | Subramanian et al. |
| 2009/0204267 A1 | 8/2009 | Sustaeta |
| 2009/0216580 A1 | 8/2009 | Bailey et al. |
| 2009/0216611 A1 | 8/2009 | Leonard et al. |
| 2009/0248375 A1 | 10/2009 | Billiotte |
| 2009/0307149 A1 | 12/2009 | Markov et al. |
| 2009/0312992 A1 | 12/2009 | Chen et al. |
| 2009/0313003 A1 | 12/2009 | Chen et al. |
| 2009/0319310 A1 | 12/2009 | Little |
| 2010/0030521 A1 | 2/2010 | Akhrarov et al. |
| 2010/0063974 A1 | 3/2010 | Papadimitriou et al. |
| 2010/0082521 A1 | 4/2010 | Meric et al. |
| 2010/0106561 A1 | 4/2010 | Peredriy et al. |
| 2010/0114899 A1 | 5/2010 | Guha et al. |
| 2010/0121868 A1 | 5/2010 | Biannic et al. |
| 2010/0153409 A1 | 6/2010 | Joshi et al. |
| 2010/0257025 A1 | 10/2010 | Brocklebank et al. |
| 2010/0257026 A1 | 10/2010 | Brocklebank et al. |
| 2010/0257133 A1 | 10/2010 | Crowe et al. |
| 2011/0098972 A1 | 4/2011 | Chen et al. |
| 2011/0106723 A1 | 5/2011 | Chipley et al. |
| 2011/0119374 A1 | 5/2011 | Ruhl et al. |
| 2011/0145223 A1 | 6/2011 | Cormode et al. |
| 2011/0153536 A1 | 6/2011 | Yang et al. |
| 2011/0167020 A1 | 7/2011 | Yang et al. |
| 2011/0208701 A1 | 8/2011 | Jackson et al. |
| 2011/0213692 A1 | 9/2011 | Crowe et al. |
| 2011/0307503 A1 | 12/2011 | Dlugosch |
| 2012/0035903 A1 | 2/2012 | Chen et al. |
| 2012/0053989 A1 | 3/2012 | Richard |
| 2012/0166142 A1 | 6/2012 | Maeda et al. |
| 2012/0271748 A1 | 10/2012 | DiSalvo |
| 2012/0310939 A1 | 12/2012 | Lee et al. |
| 2013/0024167 A1 | 1/2013 | Blair et al. |
| 2013/0024173 A1 | 1/2013 | Brzezicki et al. |
| 2013/0103657 A1 | 4/2013 | Ikawa et al. |
| 2013/0129060 A1 | 5/2013 | Gopalakrishnan et al. |
| 2013/0159348 A1 | 6/2013 | Mills et al. |
| 2013/0238399 A1 | 9/2013 | Chipley et al. |
| 2013/0325825 A1 | 12/2013 | Pope et al. |
| 2013/0339218 A1 | 12/2013 | Subramanian et al. |
| 2014/0019088 A1 | 1/2014 | Leonard et al. |
| 2014/0019448 A1 | 1/2014 | Leonard et al. |
| 2014/0019909 A1 | 1/2014 | Leonard et al. |
| 2014/0032506 A1 | 1/2014 | Hoey et al. |
| 2014/0039834 A1 | 2/2014 | Shibuya et al. |
| 2014/0046983 A1 | 2/2014 | Galloway et al. |
| 2014/0108314 A1 | 4/2014 | Chen et al. |
| 2014/0122390 A1 | 5/2014 | Narisetty et al. |
| 2014/0156382 A1 | 6/2014 | Gopalakrishnan et al. |
| 2014/0257778 A1 | 9/2014 | Leonard et al. |
| 2015/0052173 A1 | 2/2015 | Leonard et al. |
| 2015/0120263 A1 | 4/2015 | Brzezicki et al. |
| 2015/0134501 A1 | 5/2015 | Chen et al. |
| 2015/0134566 A1 | 5/2015 | Chen et al. |
| 2015/0149134 A1 | 5/2015 | Mehta et al. |
| 2015/0178646 A1 | 6/2015 | Chen et al. |
| 2015/0228097 A1 | 8/2015 | Matange et al. |
| 2015/0255983 A1 | 9/2015 | Sum et al. |
| 2015/0278153 A1 | 10/2015 | Leonard et al. |
| 2015/0302432 A1 | 10/2015 | Chien et al. |
| 2015/0302433 A1 | 10/2015 | Li |
| 2015/0317390 A1 | 11/2015 | Mill et al. |

(56) References Cited

U.S. PATENT DOCUMENTS

| | | |
|---|---|---|
| 2015/0347628 A1 | 12/2015 | Krajec et al. |
| 2016/0005055 A1 | 1/2016 | Sarferaz |
| 2016/0042101 A1 | 2/2016 | Yoshida |
| 2016/0055440 A1* | 2/2016 | Komatsu .......... G06Q 10/06315 705/7.25 |
| 2016/0155069 A1 | 6/2016 | Hoover et al. |
| 2016/0217379 A1 | 7/2016 | Patri et al. |
| 2016/0217384 A1 | 7/2016 | Leonard et al. |
| 2016/0239749 A1 | 8/2016 | Peredriy et al. |
| 2016/0246852 A1 | 8/2016 | Pope et al. |
| 2016/0246853 A1 | 8/2016 | Guirguis et al. |
| 2016/0275399 A1 | 9/2016 | Leonard et al. |
| 2016/0283621 A1 | 9/2016 | Yang et al. |
| 2016/0292324 A1 | 10/2016 | Leonard et al. |
| 2016/0350396 A1 | 12/2016 | Blanc et al. |
| 2017/0004226 A1 | 1/2017 | Skoglund et al. |
| 2017/0004405 A1 | 1/2017 | Skoglund et al. |
| 2017/0061296 A1 | 3/2017 | Joshi et al. |
| 2017/0061297 A1 | 3/2017 | Joshi et al. |
| 2017/0061315 A1 | 3/2017 | Leonard et al. |
| 2017/0076207 A1 | 3/2017 | Chipley et al. |
| 2017/0083579 A1 | 3/2017 | Du et al. |
| 2017/0228661 A1 | 8/2017 | Chien et al. |
| 2017/0284903 A1 | 10/2017 | Anderson et al. |
| 2018/0039897 A1 | 2/2018 | Joshi et al. |
| 2018/0069925 A1 | 3/2018 | Lavasani |
| 2018/0115456 A1 | 4/2018 | Bendre et al. |
| 2018/0157619 A1 | 6/2018 | Leonard et al. |
| 2018/0157620 A1 | 6/2018 | Leonard et al. |
| 2018/0173173 A1 | 6/2018 | Leonard et al. |
| 2018/0222043 A1 | 8/2018 | Trovero et al. |
| 2018/0260106 A1 | 9/2018 | Leonard et al. |
| 2019/0108460 A1 | 4/2019 | Chien et al. |
| 2019/0146849 A1 | 5/2019 | Leonard et al. |

OTHER PUBLICATIONS

Albertos, P. et al., "Virtual sensors for control applications" Annual Reviews in Control, vol. 26, No. 1, 2002, pp. 101-112.

Alharbi et al., "A new approach for selecting the number of the eigenvalues in singular spectrum analysis", Elsevier, Journal of the Franklin Institute, 353, 2016, pp. 1-16.

Alonso et al., "Analysis of the structure of vibration signals for tool wear detection", Elsevier; Mechanical Systems and Signal Processing 22, 2008, pp. 735-748.

Automatic Forecasting Systems Inc., Autobox 5.0 for Windows User's Guide, 1999, 82 pages.

Babu, "Clustering in non-stationary environments using a clan-based evolutionary approach," Biological Cybernetics, Springer Berlin | Heidelberg, vol. 73, Issue: 4, Sep. 7, 1995, pp. 367-374.

Beran, "Multivariate Forecasting in Tableau with R," accessed via internet on Aug. 1, 2016 at boraberan.wordpress.com/2016/08/01/multivariate-forecasting-in-tableau-with-r, 2016, 7 pages.

Bradley et al., "Quantitation of measurement error with Optimal Segments: basis for adaptive time course smoothing," Am J Physiol Endocrinol Metab Jun. 1, 1993 264:(6) E902-E911.

Choudhury et al., "Forecasting of Engineering Manpower Through Fuzzy Associative Memory Neural Network with ARIMA: A Comparative Study", Neurocomputing, vol. 47, Iss. 1-4, Aug. 2002, pp. 241-257.

Fan et al., "Reliability Analysis and Failure Prediction of Construction Equipment with Time Series Models" Journal of Advanced Management Science, vol. 3, No. 3, Sep. 2015, 8 pages.

Garavaglia et al., "A Smart Guide to Dummy Variables: Four Applications and a Macro," accessed from: http://web.archive.org/web/20040728083413/http://www.ats.ucla.edu/stat/sa-s/library/nesug98/p046.pdf, 2004, 10 pages.

Golyandina et al., "Basic Singular Spectrum Analysis and Forecasting with R" Computational Statistics & Data Analysis, 2013, 40 pages.

Golyandina et al., "Singular Spectrum Analysis for Time Series (Chapter 2 Basic SSA)", Springer Briefs in Statistics, 2013, pp. 11-70.

Guerard, "Automatic Time Series Modeling, Intervention Analysis, and Effective Forecasting," (1989) Journal of Statistical Computation and Simulation, 1563-5163, vol. 34, Issue 1, pp. 43-49.

Gulbis, "Data Visualization—How to Pick the Right Chart Type," accessed via internet Mar. 2016 at eazybi.com/blog/data_visualization_and_chart_types/, 2016, 17 pages.

Guralnik et al., "Event Detection from Time Series Data," Proceedings of the 5th ACM SIGKDD International Conference on Knowledge Discovery and Data Mining, 1999, pp. 33-42.

Hassani et al., "Multivariate Singular Spectrum Analysis: A General View and New Vector Forecasting Approach", International Journal of Energy and Statistics, vol. 1, No. 1, 2013, pp. 55-83.

Hassani, "Singular Spectrum Analysis: Methodology and Comparison" Journal of Data Science 5, 2007, pp. 239-257.

Huang et al., "Applications of Hilbert-Huang transform to non-stationary financial time series analysis." Appl. Stochastic Models Bus. Ind., 19, 2003, pp. 245-268.

Jacobsen et al., "Assigning Confidence to Conditional Branch Predictions", IEEE, Proceedings of the 29th Annual International Symposium on Microarchitecture, Dec. 2-4, 1996, 12 pages.

Kalpakis et al., "Distance measures for effective clustering of ARIMA time-series,"Data Mining, 2001. ICDM 2001, Proceedings IEEE International Conference on, vol., no., 2001, pp. 273-280.

Kang et al., "A virtual metrology system for semiconductor manufacturing" Expert Systems with Applications, vol. 36. No. 10, 2009, pp. 12554-12561.

Keogh et al., "An online algorithm for segmenting time series," Data Mining, 2001. ICDM 2001, Proceedings IEEE International Conference on , vol., no., 2001, pp. 289-296.

Keogh et al., "Derivative Dynamic Time Warping", In First SIAM International Conference on Data Mining (SDM'2001), Chicago, 2011, USA, pp. 1-11.

Leonard, "Large-Scale Automatic Forecasting: Millions of Forecasts." International Symposium of Forecasting. Dublin, 2002, 9 pages.

Leonard et al. "Count Series Forecasting." Proceedings of the SAS Global Forum 2015 Conference. Cary, NC. SAS Institute Inc., downloaded from http://support.sas.com/resources/papers/proceedings15/SAS1754-2015.pdf, 2015, 14 pages.

Leonard et al., "Mining Transactional and Time Series Data", abstract and presentation, International Symposium of Forecasting, 2003, 26 pages.

Leonard et al., "Mining Transactional and Time Series Data", abstract, presentation and paper, SUGI 30, Apr. 10-13, 2005, 142 pages.

Leonard, "Large-Scale Automatic Forecasting Using Inputs and Calendar Events", White Paper, 2005, pp. 1-26.

Leonard, "Large-Scale Automatic Forecasting: Millions of Forecasts", abstract and presentation, International Symposium of Forecasting, 2002, 156 pages.

Leonard, "Predictive Modeling Markup Language for Time Series Models", abstract and presentation, International Symposium on Forecasting Conference, Jul. 4-7, 2004, 35 pages.

Leonard, "Promotional Analysis and Forecasting for Demand Planning: A Practical Time Series Approach", with exhibits 1 and 2, SAS Institute Inc., Cary, North Carolina, 2000, 50 pages.

Lu et al., "A New Algorithm for Linear and Nonlinear ARMA Model Parameter Estimation Using Affine Geometry", IEEE Transactions on Biomedical Engineering, vol. 48, No. 10, Oct. 2001, pp. 1116-1124.

Malhotra et al., "Decision making using multiple models", European Journal of Operational Research, 114, 1999, pp. 1-14.

McQuarrie et al., "Regression and Time Series Model Selection", World Scientific Publishing Co. Pte. Ltd., 1998, 39 pages.

Miranian et al., "Day-ahead electricity price analysis and forecasting by singular spectrum analysis" The Institute of Engineering and Technology vol. 7, Iss. 4 (2013) pp. 337-346.

(56) References Cited

OTHER PUBLICATIONS

Oates et al., "Clustering Time Series with Hidden Markov Models and Dynamic Time Warping", Computer Science Department, LGRC University of Massachusetts, In Proceedings of the IJCAI-99, 1999, 5 pages.

Palpanas et al., "Online amnesic approximation of streaming time series," 2004. Proceedings. 20th International Conference on Data Engineering, Mar. 30-Apr. 2, 2004, 12 pages.

Quirino et al., "Scalable Cloud-Based Time Series Analysis and Forecasting", SAS Institute Inc., 22 pages.

Safavi, "Choosing the right forecasting software and system." The Journal of Business Forecasting Methods & Systems 19.3, ABI/INFORM Global, ProQuest, 2000, pp. 6-10.

SAS Institute Inc., "Base SAS® 9.4 Procedures Guide: Statistical Procedures, Fifth Edition," Nov. 2016, 570 pages.

SAS Institute Inc., "SAS Visual Forecasting 8.2 Forecasting Procedures", Dec. 2017, 85 pages.

SAS Institute Inc., "SAS Visual Forecasting 8.2 Time Series Packages", Dec. 2017, 330 pages.

SAS Institute Inc., "SAS(R) 9.3 Language Reference: Concepts, Second Edition," Cary, NC: SAS Institute, Inc., 2012, [retrieved from https://support.sas.com/documentation/cdl/en/lrcon/65287/PDF/default/lrcon.pdf], pp. 1,2,395,396,408,411,419.

SAS Institute Inc., "SAS/ETS User's Guide, Version 8," Cary NC; SAS Institute Inc., 1999, 1543 pages.

SAS Institute Inc., "SAS/QC 13.2 User's Guide," Cary, NC: SAS Publications, 2014.

SAS Institute Inc., "SAS/QC 9.1: User's Guide," Cary, NC: SAS Publications, 2004.

SAS Institute Inc., "Using Predictor Variables," Version 8, Accessed from: http://www.okstate.edu/sas/v8/saspdf/ets/chap27.pdf, 1999, pp. 1325-1349.

"Seasonal Dummy Variables," http://shazam.econ.ubc.ca/intro/dumseas.htm, Accessed from: http://web.archive.org/web/20040321055948/http://shazam.econ.ubc.ca/intro-/dumseas.htm, Mar. 2004, 6 pages.

Trovero et al., "Efficient Reconciliation of a Hierarchy of Forecasts in Presence of Constraints." Proceedings of the SAS Global Forum 2007 Conference. Cary, NC. SAS Institute Inc., downloaded from http://www2.sas.com/proceedings/forum2007/277-2007.pdf, 2007, 1 page.

Vanderplaats, "Numerical Optimization Techniques for Engineering Design", Vanderplaats Research & Development (publisher), Third Edition, 18 pp. (1999).

Wang et al.; "A structure-adaptive piece-wise linear segments representation for time series," Information Reuse and Integration, 2004. IR | 2004. Proceedings of the 2004 IEEE International Conference on , vol., no., Nov. 8-10, 2004, pp. 433-437.

Yu et al., "Time Series Forecasting with Multiple Candidate Models: Selecting or Combining?" Journal of System Science and Complexity, vol. 18, No. 1, Jan. 2005, pp. 1-18.

Khashei et al., "Performance evaluation of series and parallel strategies for financial time series forecasting", Financial Innovation, 3:24, 2017, 24 pages.

Svensson , "An Evaluation of Methods for Combining Univariate Time Series Forecasts", Lund University, Bachelor's thesis in Statistics, Apr. 2018, 49 pages.

Taylor et al., "Forecasting at Scale", The American Statistician, 72:1, Feb. 2018, pp. 37-45.

Truxillo et al., "Advanced Analytics with Enterprise Guide®", SUGI 28, Advanced Tutorials, SAS Institute Inc., Paper 9-28, 2002, 9 pages.

Wang et al., "A Survey of Visual Analytic Pipelines", Journal of Computer Science and Technology 31(4), Jul. 2016, pp. 787-804.

\* cited by examiner

PIPELINE SYSTEM FOR TIME-SERIES DATA FORECASTING

REFERENCE TO RELATED APPLICATION

This claims the benefit of priority under 35 U.S.C. § 119(e) to U.S. Provisional Patent Application No. 62/866,595, filed Jun. 25, 2019, U.S. Provisional Patent Application No. 62/700,966, filed Jul. 20, 2018, and to U.S. Provisional Patent Application No. 62/690,169, filed Jun. 26, 2018, and the benefit of priority under 35 U.S.C. 119(b) to Indian Provisional Patent Application No. 201811026489, filed Jul. 16, 2018, the entirety of each of which is hereby incorporated by reference herein.

TECHNICAL FIELD

The present disclosure relates generally to time-series data forecasting. More specifically, but not by way of limitation, this disclosure relates to a pipeline system for time-series data forecasting using a distributed computing environment.

BACKGROUND

A time series is a series of data points indexed in time order, such as a series of data collected sequentially at a fixed time interval. Time-series forecasting is the use of a model to predict future values for a time series based on previously observed values of the time series.

SUMMARY

One example of the present disclosure includes a system. The system can include a processing device and a memory device comprising instructions that are executable by the processing device. The instructions can cause the processing device to access a pipeline for forecasting a plurality of time series. The pipeline represents a sequence of operations for processing the plurality of time series to produce forecasts. The sequence of operations includes model strategy operations for applying model strategies to the plurality of time series to determine error distributions corresponding to the model strategies. Each of the model strategies is configured to receive the plurality of time series and determine champion forecasts for the plurality of time series. The champion forecasts can be determined by, for each time series among the plurality of time series: generating respective forecasts for the time series by applying forecasting models to the time series, and determining a respective champion forecast for the time series by comparing error metrics associated with the respective forecasts. Each of the model strategies is further configured to determine error values associated with the champion forecasts and generate one of the error distributions using the error values. Each of the error values indicates the accuracy of a respective champion forecast among the champion forecasts. The sequence of operations also includes a model-strategy comparison operation, which is configured to receive the error distributions corresponding to the model strategies and determine aggregate error values associated with the model strategies based on the error distributions. Each aggregate error value is associated with one of the model strategies and is determined by aggregating the error values in one of the error distributions. The model-strategy comparison operation is further configured to determine which of the model strategies is a champion model strategy for the plurality of time series by comparing the aggregate error values to one another. The instructions can further cause the processing device to execute the pipeline to determine the champion model strategy for the plurality of time series.

Another example of the present disclosure includes a method. The method includes accessing a pipeline for forecasting a plurality of time series, the pipeline representing a sequence of operations for processing the plurality of time series to produce forecasts. The sequence of operations includes model strategy operations for applying model strategies to the plurality of time series to determine error distributions corresponding to the model strategies. Each of the model strategies is configured to receive the plurality of time series and determine champion forecasts for the plurality of time series by, for each time series among the plurality of time series, generating respective forecasts for the time series by applying forecasting models to the time series and determining a respective champion forecast for the time series by comparing error metrics associated with the respective forecasts. Each of the model strategies is further configured to determine error values associated with the champion forecasts, each of the error values indicating the accuracy of a respective champion forecast among the champion forecasts and generate one of the error distributions using the error values. The sequence of operations also includes a model-strategy comparison operation, which is configured to receive the error distributions corresponding to the model strategies and determine aggregate error values associated with the model strategies based on the error distributions. Each aggregate error value is associated with one of the model strategies and is determined by aggregating the error values in one of the error distributions. The model-strategy comparison operation is configured to determine which of the model strategies is a champion model strategy for the plurality of time series by comparing the aggregate error values to one another. The method further includes executing the pipeline to determine the champion model strategy for the plurality of time series.

Yet another example of the present disclosure includes a non-transitory computer readable medium comprising instructions that are executable by a processing device. The instructions can cause the processing device to access a pipeline for forecasting a plurality of time series. The pipeline represents a sequence of operations for processing the plurality of time series to produce forecasts. The sequence of operations includes model strategy operations for applying model strategies to the plurality of time series to determine error distributions corresponding to the model strategies. Each of the model strategies is configured to receive the plurality of time series and determine champion forecasts for the plurality of time series by, for each time series among the plurality of time series, generating respective forecasts for the time series by applying forecasting models to the time series and determining a respective champion forecast for the time series by comparing error metrics associated with the respective forecasts. Each of the model strategies is further configured to determine error values associated with the champion forecasts, each of the error values indicating the accuracy of a respective champion forecast among the champion forecasts, and generate one of the error distributions using the error values. The sequence of operations also includes a model-strategy comparison operation, which is configured to receive the error distributions corresponding to the model strategies, determine aggregate error values associated with the model strategies based on the error distributions, each aggregate error value being associated with one of the model strategies and being determined by aggregating the error values in one of the error distributions, and determine which of the model strategies is a champion model strategy for the plurality of time series by comparing the aggregate error values to one another. The instructions can cause the processing device to execute the pipeline to determine the champion model strategy for the plurality of time series.

This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and examples, will become more apparent upon referring to the following specification, claims, and accompanying drawings.

BRIEF DESCRIPTION OF THE DRAWINGS

The present disclosure is described in conjunction with the appended figures.

Figure 1:
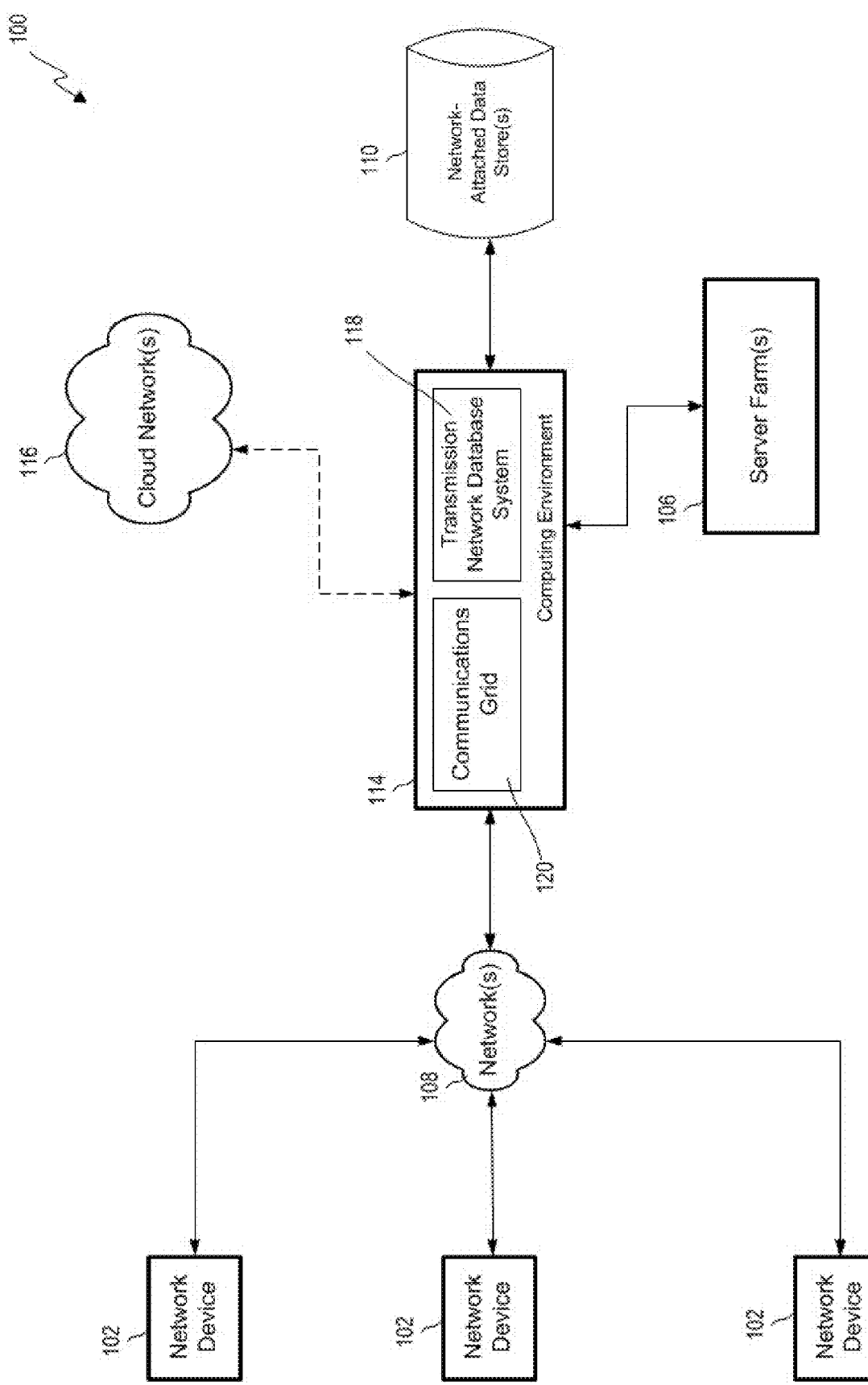
FIG. 1 is a block diagram of an example of the hardware components of a computing system according to some aspects.

In the appended figures, similar components or features can have the same reference label. Further, various components of the same type can be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Time series forecasting involves using a model to predict future values for a time series. Existing time series forecasting systems are rigid and closed. The forecasting process uses one set of modeling properties with little opportunity to specify alternative modeling approaches. Some examples of the present disclosure involve a pipeline system for time series forecasting that can overcome these problems by providing mechanisms for building and executing one or more pipelines for time series forecasting. These mechanisms can include a flexible, user-friendly, graphical user interface (GUI) components that allows complicated forecasting pipelines and projects to be built and executed efficiently, while circumventing the arduous process of programming, testing, and implementing complex commands.

Specifically, some examples of the present disclosure include a graphical user interface (GUI) in which a pipeline can be built by dragging and dropping user interface components representing different operations in a pipeline or by importing an existing pipeline. For example, the GUI can provide a library of model strategies from which a user can select and position an appropriate model strategy in the pipeline. The pipeline system can also automatically add operations to, or remove operations from, the pipeline depending on the user's selections. Examples of such operations can include pre-processing, model strategy comparison, and pipeline segmentation operations. Automatically adding and removing dependent operations can prevent failures and inaccuracies. The pipeline system can store the pipelines in files, which can be subsequently edited, copied, and transferred among users.

As described herein, a "pipeline" or a "forecast pipeline" includes a preset, repeatable sequence of operations (e.g., an end-to-end sequence of operations) for processing time series data to produce forecasts for the time series data. The sequence of operations forming a pipeline are defined and stored in a transferrable file so that various users can share and implement the pipeline. In some examples, pipelines can be generated via a graphical user interface (GUI) through which users can easily create, delete, edit, import, share, and execute them. Pipelines may be executed by a group of services (e.g., microservices) in a distributed computing environment, where each service can implement at least one aspect of the pipeline's functionality.

As one specific example, a pipeline can include an end-to-end sequence of operations for forecasting a set of time series. The operations can include a data preprocessing operation to prepare the set of time series for forecasting. The operations can also include a model strategy operations for applying various model strategies to the set of time series. The operations can further include strategy comparison operations for comparing the various model strategies to determine a champion model strategy. And the operations can include an output operation for generating a champion forecast for the set of time series based on the champion model strategy. Each of these operations is further described in turn below.

A data preprocessing operation processes the set of time series before the forecasting is perform so that the format, content or other aspects of the set of time series are compatible with the forecasting process. The data preprocessing operation can include, for example, normalizing, cleaning, adding, removing, or reformatting the set of time-series data.

A model strategy is a process defining how the set of time series is to be modeled, such as by applying different forecasting models (e.g., ARIMA, ARIMAX, or ESM) to the set of time series. The model strategy can be defined in shareable files to enable importation of the model strategy into another pipeline for execution. In some examples, a model strategy can involve determining champion forecasts for the set of time series. For each time series in the set, forecasts for the time series are generated by applying forecasting models described in the model strategy to the time series and a champion forecast for the time series can be determined by comparing error metrics associated with these forecasts. An error distribution can be generated for the model strategy using the error metrics associated with a corresponding champion forecast.

A model-strategy comparison operation compares the model strategies based on the error distributions for the model strategies to determine which of the model strategies is a champion model strategy for the time series. As used herein, a "champion model strategy" for a set of time series refers to a model strategy that produces the most accurate forecasts overall for the set of time series, measured by, for example, the smallest aggregate error value among the multiple model strategies.

An output operation produces an output containing at least some of the data generated by the pipeline, such as the champion forecasts generated by applying the champion model strategy to the set of time series.

Some examples of the present disclosure improve the time series forecasting by providing a tool that allows complicated pipelines and projects to be built and executed efficiently using flexible, user-friendly user interface components that avoid the arduous process of programming, testing, and implementing complex commands. This tool allows multiple alternative modeling strategies to be generated for multiple time series and compared simultaneously (or near simultaneously) to select a champion model strategy. This significantly improves the efficiency and flexibility of the time series forecasting system. In addition, the model strategy generated in one pipeline can be saved and reused in another pipeline for the same set of time series or a different set of time series. Likewise, the pipeline generated for a set of time series can be saved and reused for another set of time series. The reusability of the model strategy and the pipeline significantly increases the flexibility of the forecasting system and also the efficiency of performing a forecasting task.

These illustrative examples are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure.

FIGS. 1-10 depict examples of systems and methods usable for time-series data forecasting based on forecast pipelines according to some aspects. For example, FIG. 1 is a block diagram of an example of the hardware components of a computing system according to some aspects. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. The computing environment 114 may include one or more other systems. For example, computing environment 114 may include a database system 118 or a communications grid 120. The computing environment 114 can include one or more processing devices (e.g., distributed over one or more networks or otherwise in communication with one another) that, in some examples, can collectively be referred to as a processor or a processing device.

Data transmission network 100 also includes one or more network devices 102. Network devices 102 may include client devices that can communicate with computing environment 114. For example, network devices 102 may send data to the computing environment 114 to be processed, may send communications to the computing environment 114 to control different aspects of the computing environment or the data it is processing, among other reasons. Network devices 102 may interact with the computing environment 114 through a number of ways, such as, for example, over one or more networks 108.

In some examples, network devices 102 may provide a large amount of data, either all at once or streaming over a period of time (e.g., using event stream processing (ESP)), to the computing environment 114 via networks 108. For example, the network devices 102 can transmit electronic messages for use in executing one or more forecast pipelines, all at once or streaming over a period of time, to the computing environment 114 via networks 108.

The network devices 102 may include network computers, sensors, databases, or other devices that may transmit or otherwise provide data to computing environment 114. For example, network devices 102 may include local area network devices, such as routers, hubs, switches, or other computer networking devices. These devices may provide a variety of stored or generated data, such as network data or data specific to the network devices 102 themselves. Network devices 102 may also include sensors that monitor their environment or other devices to collect data regarding that environment or those devices, and such network devices 102 may provide data they collect over time. Network devices 102 may also include devices within the internet of things, such as devices within a home automation network. Some of these devices may be referred to as edge devices, and may involve edge-computing circuitry. Data may be transmitted by network devices 102 directly to computing environment 114 or to network-attached data stores, such as network-attached data stores 110 for storage so that the data may be retrieved later by the computing environment 114 or other portions of data transmission network 100. For example, the network devices 102 can transmit data usable for executing one or more forecast pipelines to a network-attached data store 110 for storage. The computing environment 114 may later retrieve the data from the network-attached data store 110 and use the data to facilitate executing forecast pipelines.

Network-attached data stores 110 can store data to be processed by the computing environment 114 as well as any intermediate or final data generated by the computing system in non-volatile memory. But in certain examples, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated dynamically (e.g., on the fly). In this situation, the computing environment 114 may be configured to retain the processed information within memory so that responses can be generated for the user at different levels of detail as well as allow a user to interactively query against this information.

Network-attached data stores 110 may store a variety of different types of data organized in a variety of different ways and from a variety of different sources. For example, network-attached data stores may include storage other than primary storage located within computing environment 114 that is directly accessible by processors located therein. Network-attached data stores may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves or transitory electronic communications. Examples of a non-transitory medium may include, for example, a magnetic disk or tape, optical storage media such as compact disk or digital versatile disk, flash memory, memory or memory devices. A computer-program product may include code or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data.

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time-stamped data may be aggregated by time (e.g., into daily time period units) to generate time-series data or structured hierarchically according to one or more dimensions (e.g., parameters, attributes, or variables). For example, data may be stored in a hierarchical data structure, such as a relational online analytical processing (ROLAP) or multidimensional online analytical processing (MOLAP) database, or may be stored in another tabular form, such as in a flat-hierarchy form.

Data transmission network 100 may also include one or more server farms 106. Computing environment 114 may route select communications or data to the sever farms 106 or one or more servers within the server farms 106. Server farms 106 can be configured to provide information in a predetermined manner. For example, server farms 106 may access data to transmit in response to a communication. Server farms 106 may be separately housed from each other device within data transmission network 100, such as computing environment 114, or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more websites, sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain examples, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network 116 can dynamically scale to meet the needs of its users. The cloud network 116 may include one or more computers, servers, or systems. In some examples, the computers, servers, or systems that make up the cloud network 116 are different from the user's own on-premises computers, servers, or systems. For example, the cloud network 116 may host an application, and a user may, via a communication network such as the Internet, order and use the application on demand. In some examples, the cloud network 116 may host an application for executing forecast pipelines to generate forecasts for time-series data.

While each device, server, and system in FIG. 1 is shown as a single device, multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between a device and connection management system 150, between server farms 106 and computing environment 114, or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a Bluetooth or a Bluetooth Low Energy channel. A wired network may include a wired interface. The wired or wireless networks may be implemented using routers, access points, bridges, gateways, or the like, to connect devices in the network 108. The networks 108 can be incorporated entirely within or can include an intranet, an extranet, or a combination thereof. In one example, communications between two or more systems or devices can be achieved by a secure communications protocol, such as secure sockets layer (SSL) or transport layer security (TLS). In addition, data or transactional details may be encrypted.

Some aspects may utilize the Internet of Things (IoT), where things (e.g., machines, devices, phones, sensors) can be connected to networks and the data from these things can be collected and processed within the things or external to the things. For example, the IoT can include sensors in many different devices, and high value analytics can be applied to identify hidden relationships and drive increased efficiencies. This can apply to both big data analytics and real-time (e.g., ESP) analytics.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The computing nodes in the communications grid 120 and the transmission network database system 118 may share the same processor hardware, such as processors that are located within computing environment 114.

In some examples, the computing environment 114, a network device 102, or both can implement one or more processes for executing forecast pipelines to generate forecasts for time-series data. For example, the computing environment 114, a network device 102, or both can implement one or more versions of the processes discussed with respect to any of the figures.

Figure 2:
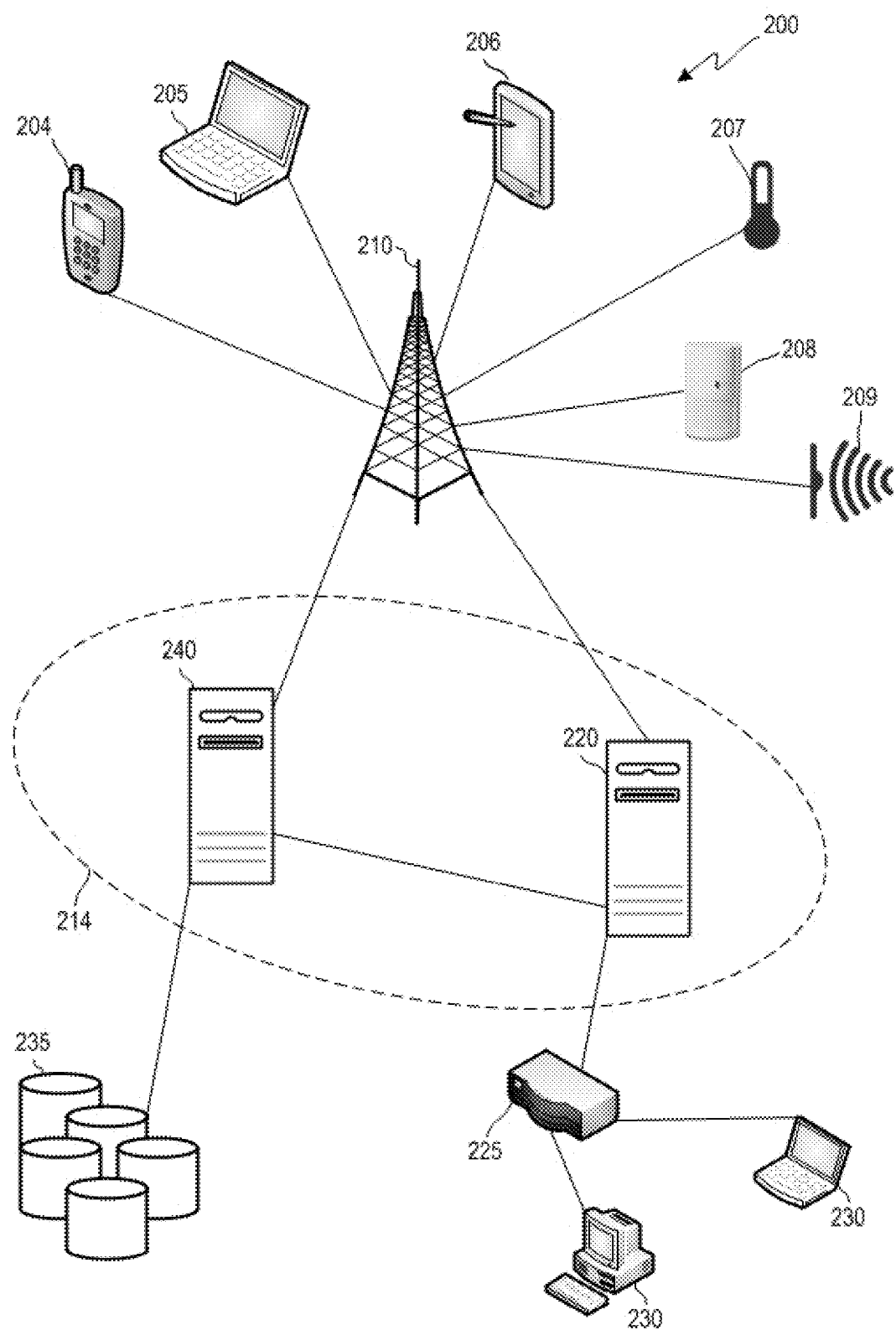
FIG. 2 is an example of devices that can communicate with each other over an exchange system and via a network according to some aspects.

FIG. 2 is an example of devices that can communicate with each other over an exchange system and via a network according to some aspects. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). In some examples, the communication can include times series data. The communication can be routed to another network device, such as network devices 205-209, via base station 210. The communication can also be routed to computing environment 214 via base station 210. In some examples, the network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current, among others. The sensors may be mounted to various components used as part of a variety of different types of systems. The network devices may detect and record data related to the environment that it monitors, and transmit that data to computing environment 214.

The network devices 204-209 may also perform processing on data it collects before transmitting the data to the computing environment 214, or before deciding whether to transmit data to the computing environment 214. For example, network devices 204-209 may determine whether data collected meets certain rules, for example by comparing data or values calculated from the data and comparing that data to one or more thresholds. The network devices 204-209 may use this data or comparisons to determine if the data is to be transmitted to the computing environment 214 for further use or processing. In some examples, the network devices 204-209 can pre-process the data prior to transmitting the data to the computing environment 214. For example, the network devices 204-209 can reformat the data before transmitting the data to the computing environment 214 for further processing (e.g., analyzing the data to facilitate the execution of forecast pipelines).

Computing environment 214 may include machines 220, 240. Although computing environment 214 is shown in FIG. 2 as having two machines 220, 240, computing environment 214 may have only one machine or may have more than two machines. The machines 220, 240 that make up computing environment 214 may include specialized computers, servers, or other machines that are configured to individually or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other internetwork or intra-network connection components. For example, computing environment 214 may communicate with client devices 230 via one or more routers 225. Computing environment 214 may collect, analyze or store data from or pertaining to communications, client device operations, client rules, or user-associated actions stored at one or more data stores 235. Such data may influence communication routing to the devices within computing environment 214, how data is stored or processed within computing environment 214, among other actions.

Notably, various other devices can further be used to influence communication routing or processing between devices within computing environment 214 and with devices outside of computing environment 214. For example, as shown in FIG. 2, computing environment 214 may include a machine 240 that is a web server. Computing environment 214 can retrieve data of interest, such as client information (e.g., product information, client rules, etc.), technical product details, news, blog posts, e-mails, forum posts, electronic documents, social media posts (e.g., Twitter™ posts or Facebook™ posts), time-series data, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices 204-209 may receive data periodically and in real time from a web server or other source. Devices within computing environment 214 may also perform pre-analysis on data it receives to determine if the data received should be processed as part of an ongoing project. For example, as part of a project in which forecasts are to be generated for time-series data, the computing environment 214 can perform a pre-analysis of the data. The pre-analysis can include determining whether the data is in a correct format for executing the forecast pipelines using the data and, if not, reformatting the data into the correct format.

Figure 3:
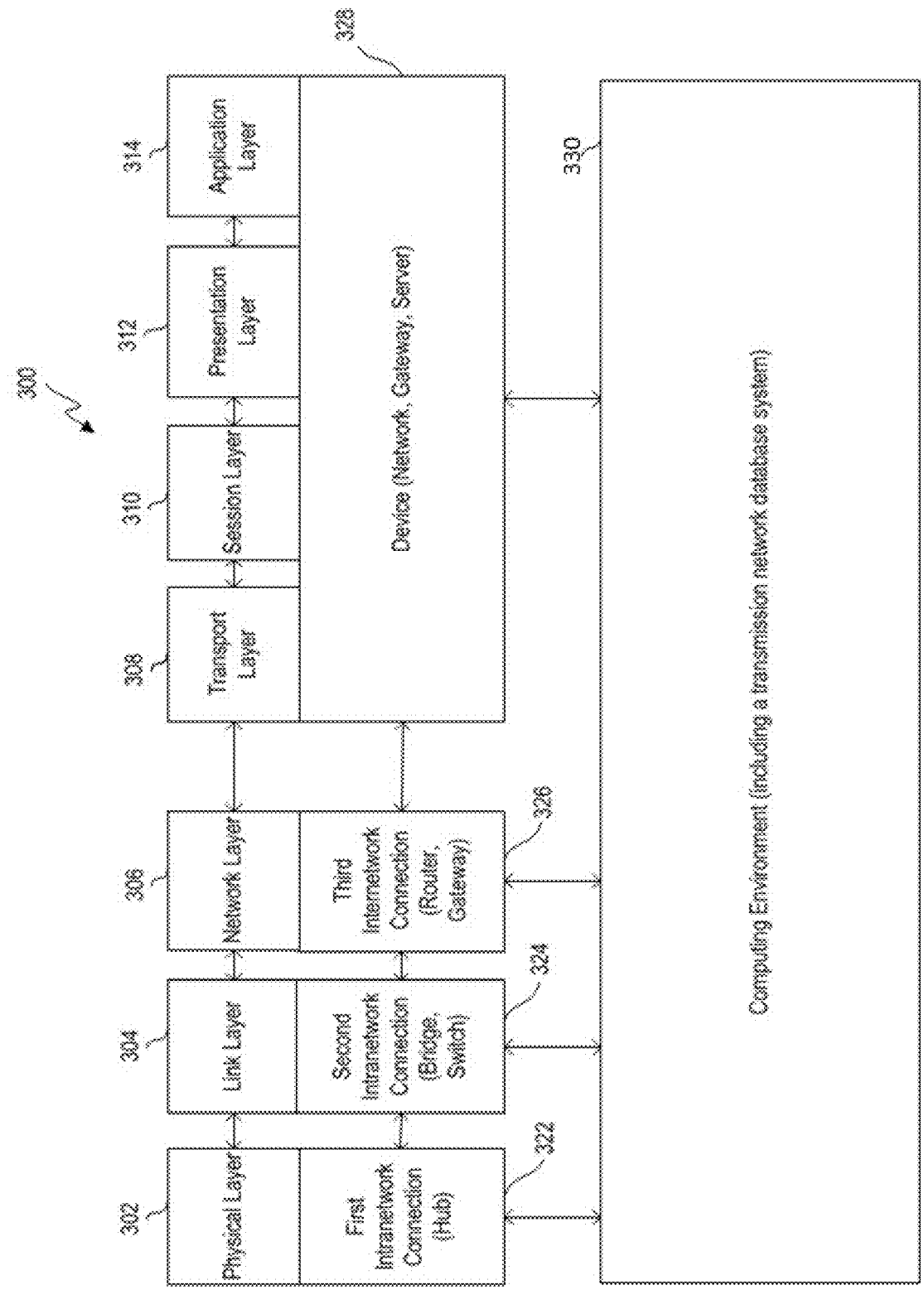
FIG. 3 is a block diagram of a model of an example of a communications protocol system according to some aspects.

FIG. 3 is a block diagram of a model of an example of a communications protocol system according to some aspects. More specifically, FIG. 3 identifies operation of a computing environment in an Open Systems Interaction model that corresponds to various connection components. The model 300 shows, for example, how a computing environment, such as computing environment (or computing environment 214 in FIG. 2) may communicate with other devices in its network, and control how communications between the computing environment and other devices are executed and under what conditions.

The model 300 can include layers 302-314. The layers 302-314 are arranged in a stack. Each layer in the stack serves the layer one level higher than it (except for the application layer, which is the highest layer), and is served by the layer one level below it (except for the physical layer 302, which is the lowest layer). The physical layer 302 is the lowest layer because it receives and transmits raw bites of data, and is the farthest layer from the user in a communications system. On the other hand, the application layer is the highest layer because it interacts directly with a software application.

As noted, the model 300 includes a physical layer 302. Physical layer 302 represents physical communication, and can define parameters of that physical communication. For example, such physical communication may come in the form of electrical, optical, or electromagnetic communications. Physical layer 302 also defines protocols that may control communications within a data transmission network.

Link layer 304 defines links and mechanisms used to transmit (e.g., move) data across a network. The link layer manages node-to-node communications, such as within a grid-computing environment. Link layer 304 can detect and correct errors (e.g., transmission errors in the physical layer 302). Link layer 304 can also include a media access control (MAC) layer and logical link control (LLC) layer.

Network layer 306 can define the protocol for routing within a network. In other words, the network layer coordinates transferring data across nodes in a same network (e.g., such as a grid-computing environment). Network layer 306 can also define the processes used to structure local addressing within the network.

Transport layer 308 can manage the transmission of data and the quality of the transmission or receipt of that data. Transport layer 308 can provide a protocol for transferring data, such as, for example, a Transmission Control Protocol (TCP). Transport layer 308 can assemble and disassemble data frames for transmission. The transport layer can also detect transmission errors occurring in the layers below it.

Session layer 310 can establish, maintain, and manage communication connections between devices on a network. In other words, the session layer controls the dialogues or nature of communications between network devices on the network. The session layer may also establish checkpointing, adjournment, termination, and restart procedures.

Presentation layer 312 can provide translation for communications between the application and network layers. In other words, this layer may encrypt, decrypt or format data based on data types known to be accepted by an application or network layer.

Application layer 314 interacts directly with software applications and end users, and manages communications between them. Application layer 314 can identify destinations, local resource states or availability or communication content or formatting using the applications.

For example, a communication link can be established between two devices on a network. One device can transmit an analog or digital representation of an electronic message that includes a data set to the other device. The other device can receive the analog or digital representation at the physical layer 302. The other device can transmit the data associated with the electronic message through the remaining layers 304-314. The application layer 314 can receive data associated with the electronic message. The application layer 314 can identify one or more applications, such as an application for executing forecast pipelines, to which to transmit data associated with the electronic message. The application layer 314 can transmit the data to the identified application.

Intra-network connection components 322, 324 can operate in lower levels, such as physical layer 302 and link layer 304, respectively. For example, a hub can operate in the physical layer, a switch can operate in the physical layer, and a router can operate in the network layer. Inter-network connection components 326, 328 are shown to operate on higher levels, such as layers 306-314. For example, routers can operate in the network layer and network devices can operate in the transport, session, presentation, and application layers.

A computing environment 330 can interact with or operate on, in various examples, one, more, all or any of the various layers. For example, computing environment 330 can interact with a hub (e.g., via the link layer) to adjust which devices the hub communicates with. The physical layer 302 may be served by the link layer 304, so it may implement such data from the link layer 304. For example, the computing environment 330 may control which devices from which it can receive data. For example, if the computing environment 330 knows that a certain network device has turned off, broken, or otherwise become unavailable or unreliable, the computing environment 330 may instruct the hub to prevent any data from being transmitted to the computing environment 330 from that network device. Such a process may be beneficial to avoid receiving data that is inaccurate or that has been influenced by an uncontrolled environment. As another example, computing environment 330 can communicate with a bridge, switch, router or gateway and influence which device within the system (e.g., system 200) the component selects as a destination. In some examples, computing environment 330 can interact with various layers by exchanging communications with equipment operating on a particular layer by routing or modifying existing communications. In another example, such as in a grid-computing environment, a node may determine how data within the environment should be routed (e.g., which node should receive certain data) based on certain parameters or information provided by other layers within the model.

The computing environment 330 may be a part of a communications grid environment, the communications of which may be implemented as shown in the protocol of FIG. 3. For example, referring back to FIG. 2, one or more of machines 220 and 240 may be part of a communications grid-computing environment. A gridded computing environment may be employed in a distributed system with non-interactive workloads where data resides in memory on the machines, or compute nodes. In such an environment, analytic code, instead of a database management system, can control the processing performed by the nodes. Data is co-located by pre-distributing it to the grid nodes, and the analytic code on each node loads the local data into memory. Each node may be assigned a particular task, such as a portion of a processing project, or to organize or control other nodes within the grid. For example, each node may be assigned a portion of a processing task for executing forecast pipelines to generate forecasts for time-series data.

Figure 4:
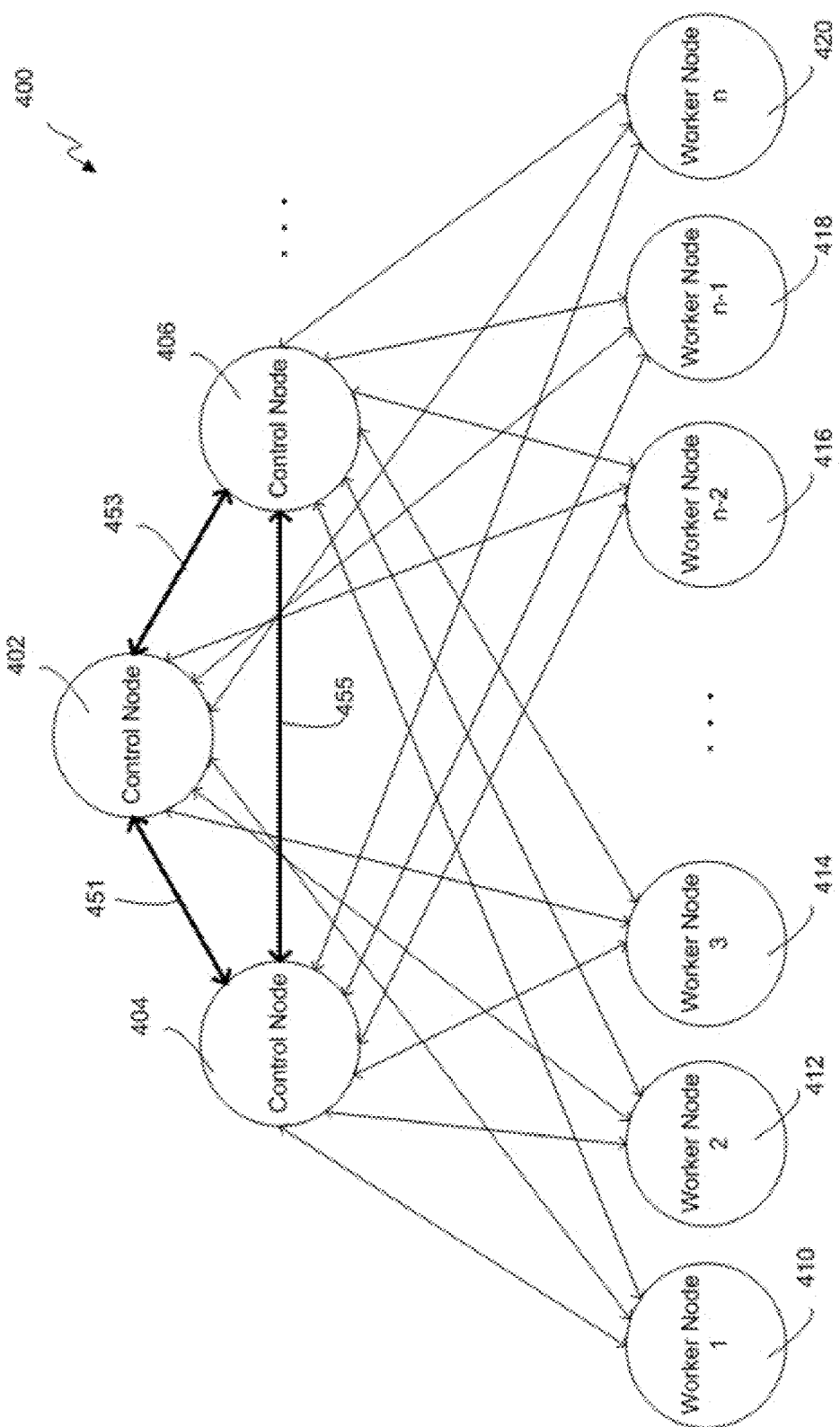
FIG. 4 is a hierarchical diagram of an example of a communications grid computing system including a variety of control and worker nodes according to some aspects.

FIG. 4 is a hierarchical diagram of an example of a communications grid computing system 400 including a variety of control and worker nodes according to some aspects. Communications grid computing system 400 includes three control nodes and one or more worker nodes. Communications grid computing system 400 includes control nodes 402, 404, and 406. The control nodes are communicatively connected via communication paths 451, 453, and 455. The control nodes 402-406 may transmit information (e.g., related to the communications grid or notifications) to and receive information from each other. Although communications grid computing system 400 is shown in FIG. 4 as including three control nodes, the communications grid may include more or less than three control nodes.

Communications grid computing system 400 (which can be referred to as a "communications grid") also includes one or more worker nodes. Shown in FIG. 4 are six worker nodes 410-420. Although FIG. 4 shows six worker nodes, a communications grid can include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid computing system 400 may be connected (wired or wirelessly, and directly or indirectly) to control nodes 402-406. Each worker node may receive information from the control nodes (e.g., an instruction to perform work on a project) and may transmit information to the control nodes (e.g., a result from work performed on a project). Furthermore, worker nodes may communicate with each other directly or indirectly. For example, worker nodes may transmit data between each other related to a job being performed or an individual task within a job being performed by that worker node. In some examples, worker nodes may not be connected (communicatively or otherwise) to certain other worker nodes. For example, a worker node 410 may only be able to communicate with a particular control node 402. The worker node 410 may be unable to communicate with other worker nodes 412-420 in the communications grid, even if the other worker nodes 412-420 are controlled by the same control node 402.

A control node 402-406 may connect with an external device with which the control node 402-406 may communicate (e.g., a communications grid user, such as a server or computer, may connect to a controller of the grid). For example, a server or computer may connect to control nodes 402-406 and may transmit a project or job to the node, such as a project or job related to executing forecast pipelines to generate forecasts for time-series data. The project may include the data set. The data set may be of any size. Once the control node 402-406 receives such a project including a large data set, the control node may distribute the data set or projects related to the data set to be performed by worker nodes. Alternatively, for a project including a large data set, the data set may be receive or stored by a machine other than a control node 402-406 (e.g., a Hadoop data node).

Control nodes 402-406 can maintain knowledge of the status of the nodes in the grid (e.g., grid status information), accept work requests from clients, subdivide the work across worker nodes, and coordinate the worker nodes, among other responsibilities. Worker nodes 412-420 may accept work requests from a control node 402-406 and provide the control node with results of the work performed by the worker node. A grid may be started from a single node (e.g., a machine, computer, server, etc.). This first node may be assigned or may start as the primary control node 402 that will control any additional nodes that enter the grid.

When a project is submitted for execution (e.g., by a client or a controller of the grid) it may be assigned to a set of nodes. After the nodes are assigned to a project, a data structure (e.g., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node 402 receives a project, the primary control node may distribute portions of the project to its worker nodes for execution. For example, a project for executing forecast pipelines to generate forecasts for time-series data can be initiated on communications grid computing system 400. A primary control node can control the work to be performed for the project in order to complete the project as requested or instructed. The primary control node may distribute work to the worker nodes 412-420 based on various factors, such as which subsets or portions of projects may be completed most efficiently and in the correct amount of time. For example, a worker node 412 may execute executing software modules involved in the forecast pipelines using at least a portion of data that is already local (e.g., stored on) the worker node. The primary control node also coordinates and processes the results of the work performed by each worker node 412-420 after each worker node 412-420 executes and completes its job. For example, the primary control node may receive a result from one or more worker nodes 412-420, and the primary control node may organize (e.g., collect and assemble) the results received and compile them to produce a complete result for the project received from the end user.

Any remaining control nodes, such as control nodes 404, 406, may be assigned as backup control nodes for the project. In an example, backup control nodes may not control any portion of the project. Instead, backup control nodes may serve as a backup for the primary control node and take over as primary control node if the primary control node were to fail. If a communications grid were to include only a single control node 402, and the control node 402 were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes 402-406, including a backup control node, may be beneficial.

In some examples, the primary control node may open a pair of listening sockets to add another node or machine to the grid. A socket may be used to accept work requests from clients, and the second socket may be used to accept connections from other grid nodes. The primary control node may be provided with a list of other nodes (e.g., other machines, computers, servers, etc.) that can participate in the grid, and the role that each node can fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it can check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. But, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404, 406 (and, for example, to other control or worker nodes 412-420 within the communications grid). Such communications may be sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes 410-420 in the communications grid, unique identifiers of the worker nodes 410-420, or their relationships with the primary control node 402) and the status of a project (including, for example, the status of each worker node's portion of the project). The snapshot may also include analysis or results received from worker nodes 410-420 in the communications grid. The backup control nodes 404, 406 may receive and store the backup data received from the primary control node 402. The backup control nodes 404, 406 may transmit a request for such a snapshot (or other information) from the primary control node 402, or the primary control node 402 may send such information periodically to the backup control nodes 404, 406.

As noted, the backup data may allow a backup control node 404, 406 to take over as primary control node if the primary control node 402 fails without requiring the communications grid to start the project over from scratch. If the primary control node 402 fails, the backup control node 404, 406 that will take over as primary control node may retrieve the most recent version of the snapshot received from the primary control node 402 and use the snapshot to continue the project from the stage of the project indicated by the backup data. This may prevent failure of the project as a whole.

A backup control node 404, 406 may use various methods to determine that the primary control node 402 has failed. In one example of such a method, the primary control node 402 may transmit (e.g., periodically) a communication to the backup control node 404, 406 that indicates that the primary control node 402 is working and has not failed, such as a heartbeat communication. The backup control node 404, 406 may determine that the primary control node 402 has failed if the backup control node has not received a heartbeat communication for a certain predetermined period of time. Alternatively, a backup control node 404, 406 may also receive a communication from the primary control node 402 itself (before it failed) or from a worker node 410-420 that the primary control node 402 has failed, for example because the primary control node 402 has failed to communicate with the worker node 410-420.

Different methods may be performed to determine which backup control node of a set of backup control nodes (e.g., backup control nodes 404, 406) can take over for failed primary control node 402 and become the new primary control node. For example, the new primary control node may be chosen based on a ranking or "hierarchy" of backup control nodes based on their unique identifiers. In an alternative example, a backup control node may be assigned to be the new primary control node by another device in the communications grid or from an external device (e.g., a system infrastructure or an end user, such as a server or computer, controlling the communications grid). In another alternative example, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative example, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed. In some examples, a communications grid computing system 400 can be used to execute the operations involved in the forecast pipelines.

Figure 5:
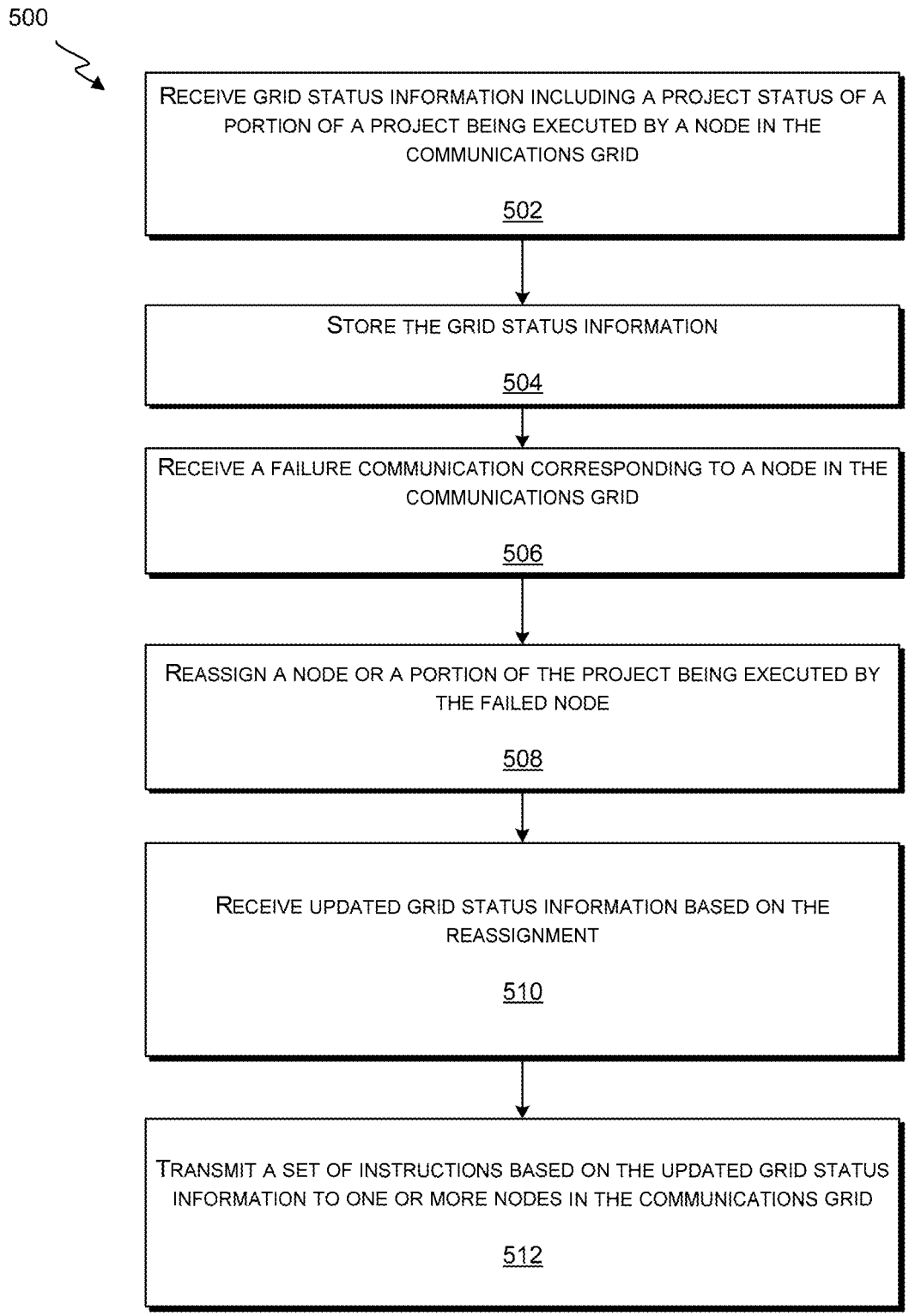
FIG. 5 is a flow chart of an example of a process for adjusting a communications grid or a work project in a communications grid after a failure of a node according to some aspects.

FIG. 5 is a flow chart of an example of a process for adjusting a communications grid or a work project in a communications grid after a failure of a node according to some aspects. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
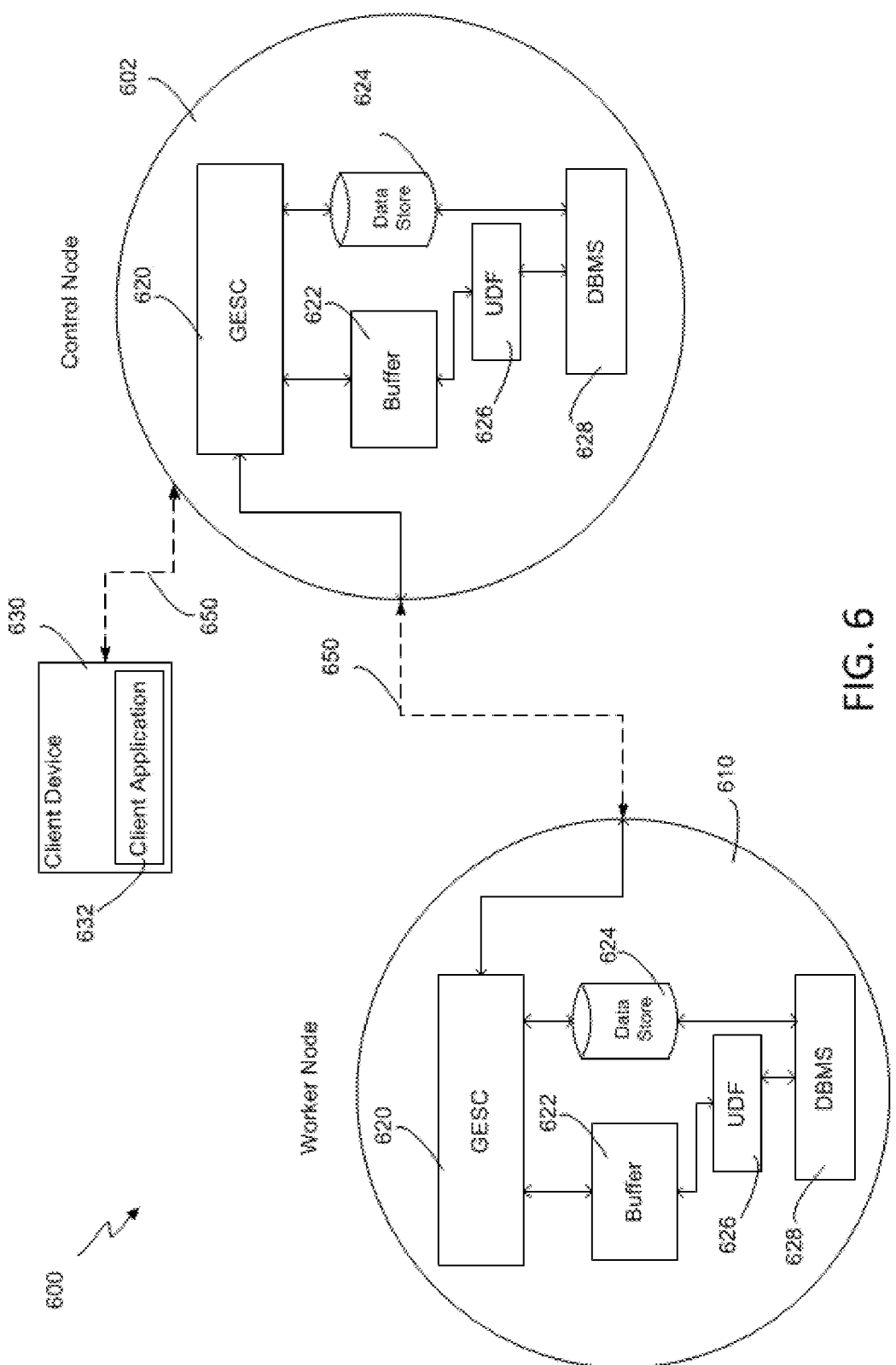
FIG. 6 is a block diagram of a portion of a communications grid computing system including a control node and a worker node according to some aspects.

FIG. 6 is a block diagram of a portion of a communications grid computing system 600 including a control node and a worker node according to some aspects. Communications grid 600 computing system includes one control node (control node 602) and one worker node (worker node 610) for purposes of illustration, but may include more worker and/or control nodes. The control node 602 is communicatively connected to worker node 610 via communication path 650. Therefore, control node 602 may transmit information (e.g., related to the communications grid or notifications), to and receive information from worker node 610 via communication path 650.

Similar to in FIG. 4, communications grid computing system (or just "communications grid") 600 includes data processing nodes (control node 602 and worker node 610). Nodes 602 and 610 comprise multi-core data processors. Each node 602 and 610 includes a grid-enabled software component (GESC) 620 that executes on the data processor associated with that node and interfaces with buffer memory 622 also associated with that node. Each node 602 and 610 includes database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However in certain examples, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DMBS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 610 may be connected via a network, such as network 108 shown in FIG. 1. Therefore, nodes 602 and 610 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DMBS 628 may control the creation, maintenance, and use of database or data structure (not shown) within nodes 602 or 610. The database may organize data stored in data stores 624. The DMBS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
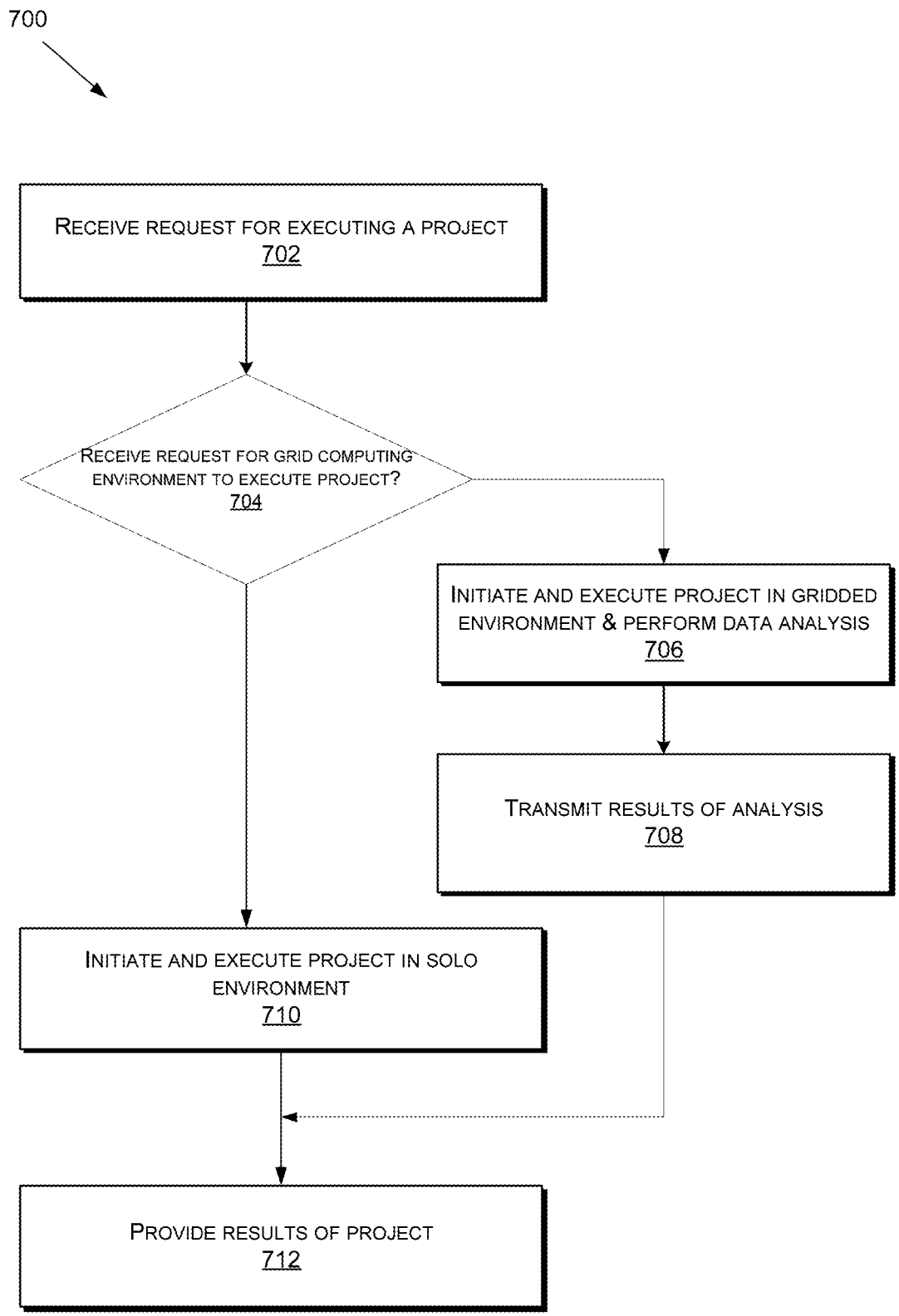
FIG. 7 is a flow chart of an example of a process for executing a data analysis or processing project according to some aspects.

FIG. 7 is a flow chart of an example of a process for executing a data analysis or a processing project according to some aspects. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

Figure 8:
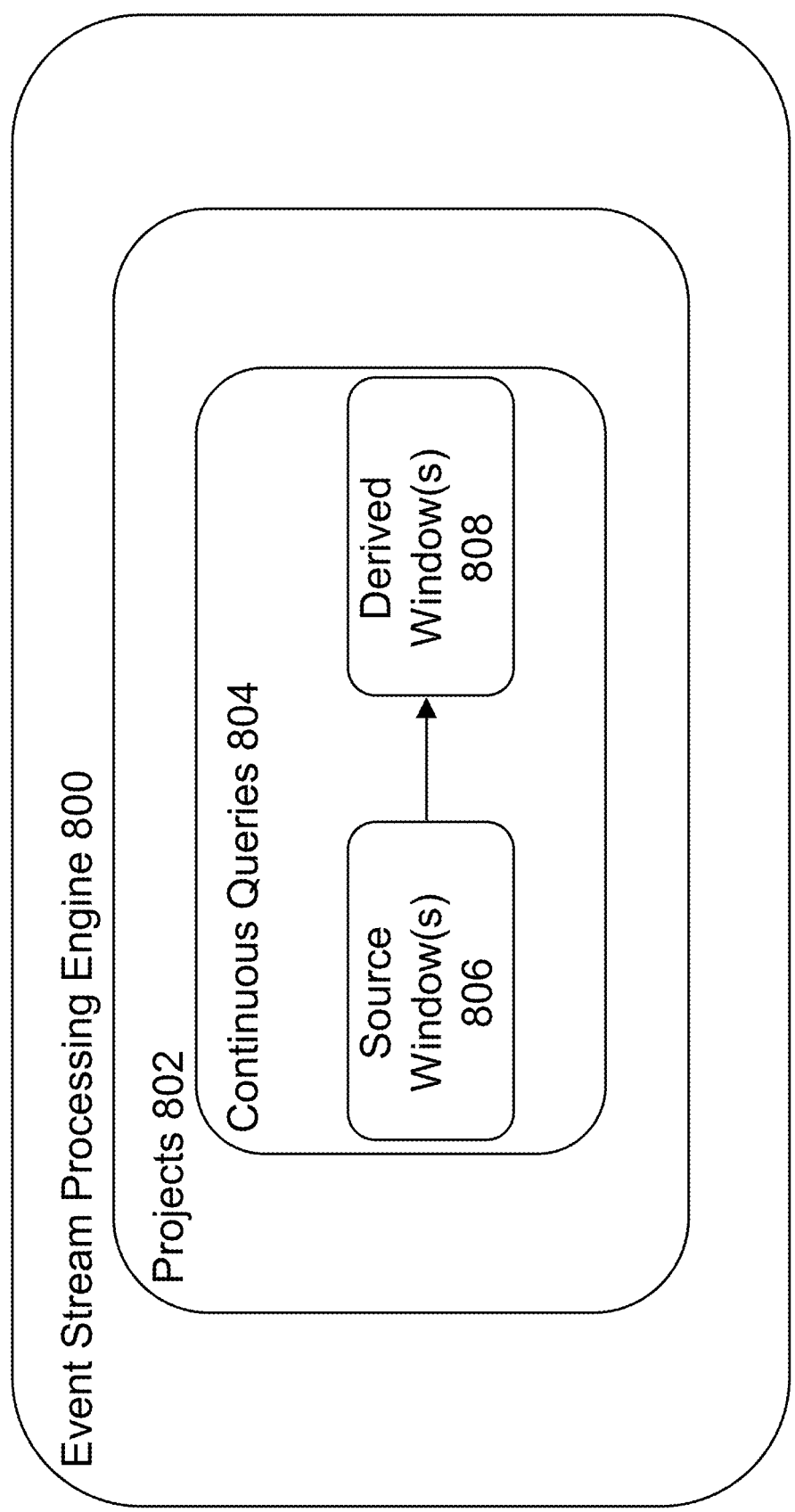
FIG. 8 is a block diagram including components of an Event Stream Processing Engine (ESPE) according to some aspects.

FIG. 8 is a block diagram including components of an Event Stream Processing Engine (ESPE) according to some aspects. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

Figure 9:
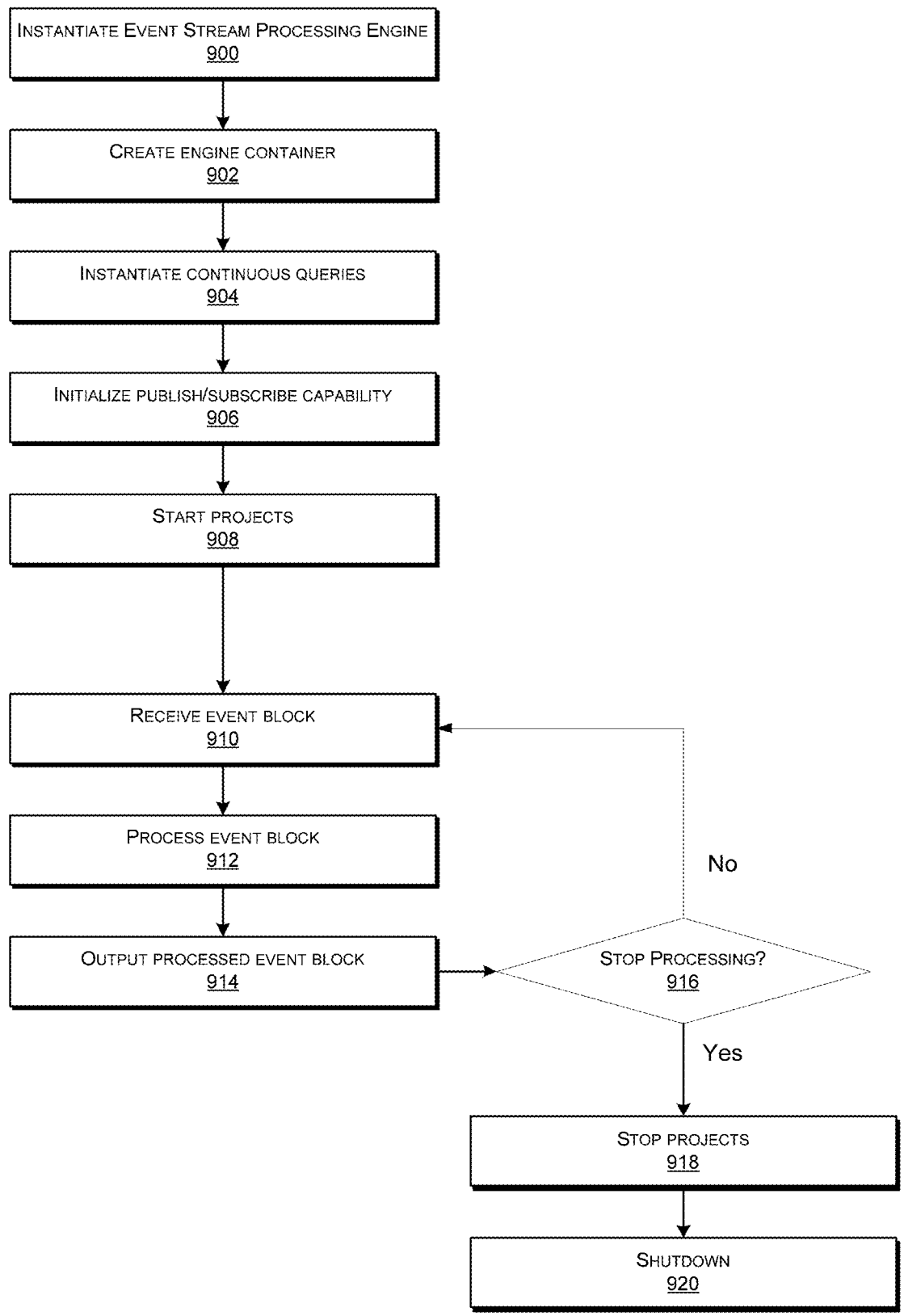
FIG. 9 is a flow chart of an example of a process including operations performed by an event stream processing engine according to some aspects.

FIG. 9 is a flow chart of an example of a process including operations performed by an event stream processing engine according to some aspects. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. Various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

Figure 10:
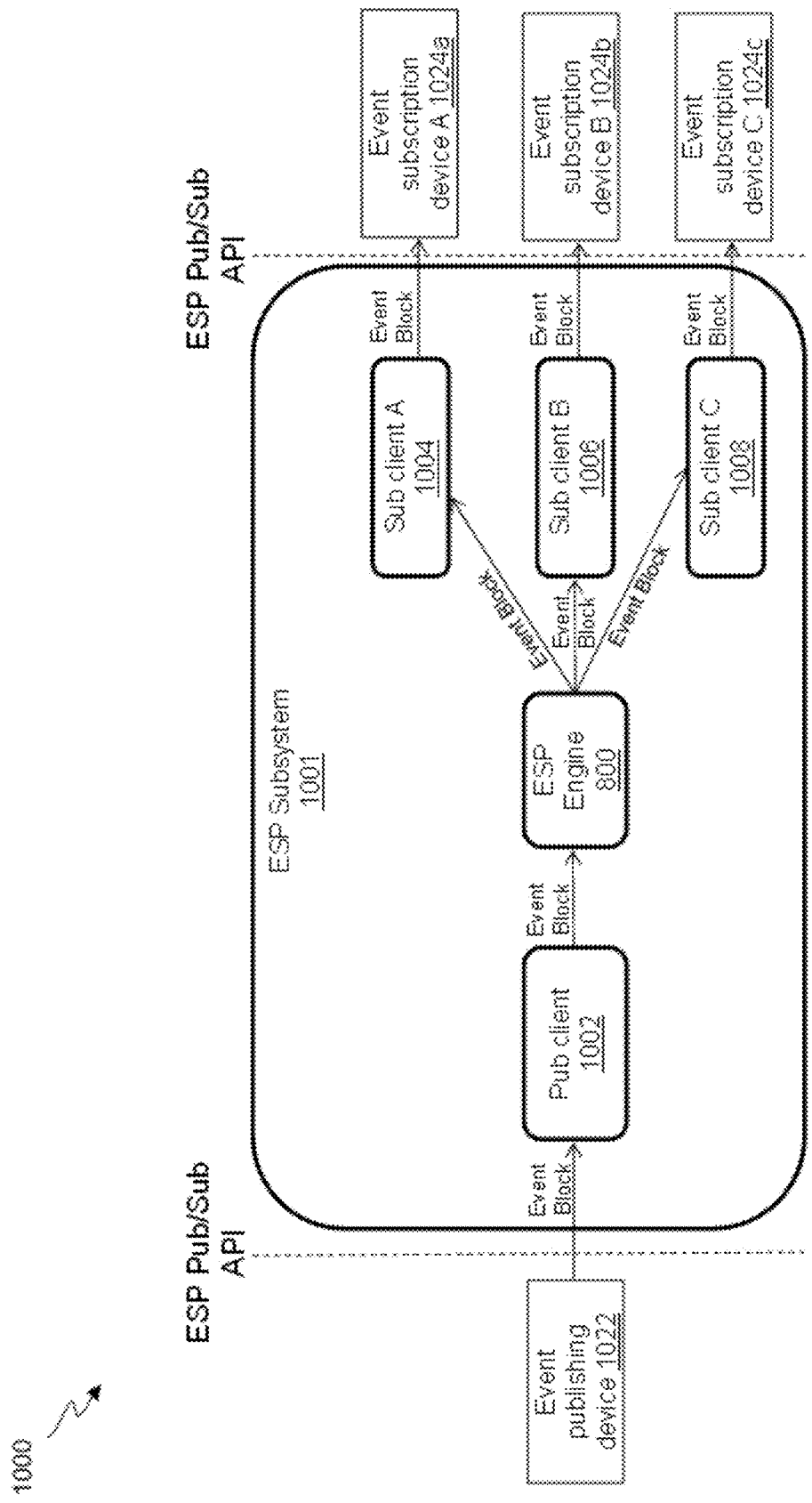
FIG. 10 is a block diagram of an ESP system interfacing between a publishing device and multiple event subscribing devices according to some aspects.

FIG. 10 is a block diagram of an ESP system 1000 interfacing between publishing device 1022 and event subscription devices 1024a-c according to some aspects. ESP system 1000 may include ESP subsystem 1001, publishing device 1022, an event subscription device A 1024a, an event subscription device B 1024b, and an event subscription device C 1024c. Input event streams are output to ESP subsystem 1001 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscription device A 1024a, event subscription device B 1024b, and event subscription device C 1024c. ESP system 1000 may include a greater or a fewer number of event subscription devices of event subscription devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscription device A 1024a, event subscription device B 1024b, and event subscription device C 1024c, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscription device A 1024a, event subscription device B 1024b, and event subscription device C 1024c.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the publishing device 1022.

ESP subsystem 1001 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscription device A 1024a using the publish/subscribe API. Subscribing client B 1006 may be started by an event subscription application B executing at event subscription device B 1024b using the publish/subscribe API. Subscribing client C 1008 may be started by an event subscription application C executing at event subscription device C 1024c using the publish/subscribe API.

An event block object containing one or more event objects is injected into a source window of the one or more source windows 806 from an instance of an event publishing application on publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024a, event subscription device B 1024b, and event subscription device C 1024c. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscription devices 1024a-c. For example, subscribing client A 1004, subscribing client B 1006, and subscribing client C 1008 may send the received event block object to event subscription device A 1024a, event subscription device B 1024b, and event subscription device C 1024c, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some examples, big data is processed for an analytics project after the data is received and stored. In other examples, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the present disclosure provide technical solutions to technical problems, such as computing problems that arise when an ESP device fails which results in a complete service interruption and potentially significant data loss. The data loss can be catastrophic when the streamed data is supporting mission critical operations, such as those in support of an ongoing manufacturing or drilling operation. An example of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, one or more processors and one or more computer-readable mediums operably coupled to the one or more processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

Some embodiments may involve neural network functionality and settings with time series, such as Stacked Model (Neural Network+Time Series) Forecasting Settings (e.g., feature generation settings, model generation settings, model training settings, and model selection options), Neural Network Settings (e.g., task settings, feature generation settings, model generation settings, model training settings, autotune settings, model validation settings, and forecast properties), and Neural Network Model Settings (e.g., dependent variable trend, forecast of dependent variable, dependent variable lags, output layer direct connections, number of hidden layers, number of neurons in layer(s), types of activation functions, random seeds to initialize the network, dependent variable activation function, input standardization methods, dependent variable standardization methods, types of error functions, maximum training iterations).

The stacked modeling strategy can generate forecasts using stacked models that are composed of a neural network model (NN) and a time series model (TS). This modeling strategy can capture the nonlinear relationships between the dependent and independent variables, as well as time series characteristics in the data, such as seasonality and trend. It can model the time series in two steps: in the first step, the neural network model is used to generate the forecasts; and in the second step, the residuals from the first step are passed to the time series model to generate the residual forecasts. In some embodiments, the first and second steps can run sequentially. The final forecasts can be the sum of the forecast from the neural network and the residual forecasts from the time series model.

Figure 11:
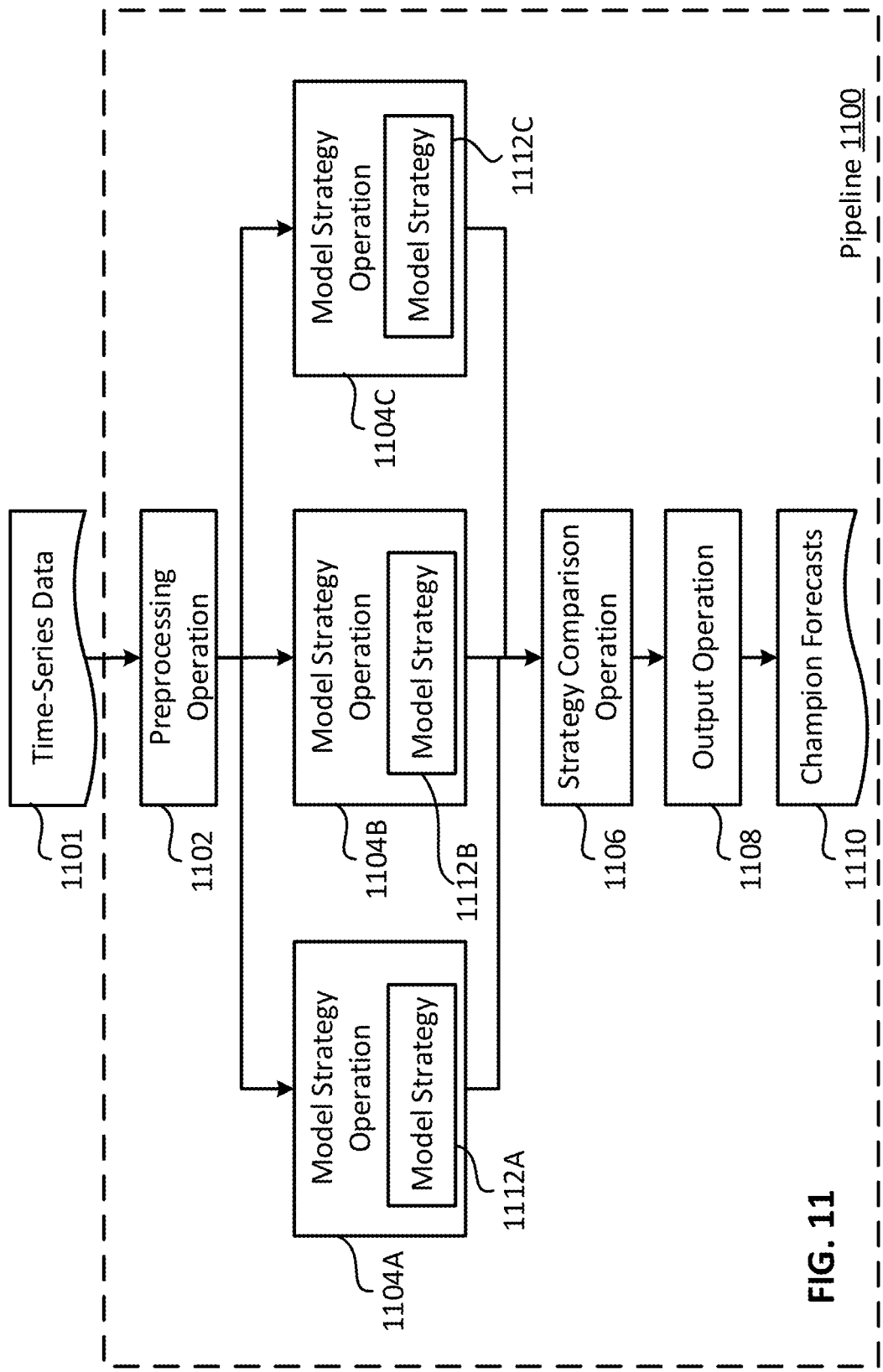
FIG. 11 is an example of a pipeline for determining a forecast for time-series data according to some aspects.

FIG. 11 illustrates an example of a pipeline 1100 for determining champion forecasts 1110 for time-series data 1101 according to some aspects. The time-series data 1101 includes multiple time series for each of which a forecast is to be generated. As a result, the champion forecasts 1110 includes multiple champion forecasts, each champion forecast corresponding to one of the multiple time series in the time-series data 1101.

The pipeline 1100 can be defined in a file, such as a JSON file, indicating the operations to be executed for the pipeline. The file is shareable with other users and formatted to enable the other users to import the pipeline 1100 into a forecasting software environment and execute the pipeline 1100. The pipeline 1100 can be accessed by loading the file of the pipeline 1100 into a software environment and executed by executing the pipeline 1100 using the software environment. The software environment can be a forecasting software environment, which is a software environment configured to enable a user to import and execute pipelines to produce forecasts of time series data. The pipeline 1100 can be implemented by invoking proper services (e.g., microservices) of a distributed computing environment underlying the software environment. This is described in greater detail later in the application with reference to FIG. 19.

In the example shown in FIG. 11, the sequence of operations for the pipeline 1100 includes a preprocessing operation 1102 to generate preprocessed data by preprocessing a raw version of the time-series data 1101. The preprocessed data may or may not contain the same number of time series as the time-series data 1101. The preprocessing operation 1102 preprocesses the time-series data 1101 to, for example, normalize, clean, add, remove, or reformat the time-series data 1101. For example, the preprocessing operation 1102 can involve cleaning the time-series data 1101 to remove the noise or other unnecessary data contained therein, such as data recorded outside the specified time period or data not recorded at the specified time interval. The preprocessing operation 1102 can also involve adding data to the time-series data 1101, such as data indicating the time points that the time-series data 1101 were recorded or other metadata used in producing the forecast 1110 for the time-series data 1101. Furthermore, the preprocessing operation 1102 can involve changing the time-series data 1101 into a format that is compatible with the data format used by the underlying services to execute the pipeline 1100. Other operations can be performed in the preprocessing operation 1102.

The sequence of operations for the pipeline 1100 also include model strategy operations 1104A-C and strategy comparison operation 1106. Each of the model strategy operations 1104A-C is configured to operate on the preprocessed data generated from the preprocessing operation 1102 and to execute, in parallel, modeling strategies 1112A-C involved in the respective model strategy operations 1104 to generate a forecast for each of the multiple time series contained in the preprocessed data. The generated forecasts are analyzed in the strategy comparison operation 1106. Based on the analysis, the champion model strategy for the time-series data 1101 that provided the best prediction results for the time-series data 1101 can be determined. Thereafter, an output operation 1108 can be implemented to determine champion forecasts 1110 for the time-series data 1101 based on the champion model strategy. Each of these operations are further described below in detail.

In some examples, a model strategy used in the model strategy operations 1104A-C involves applying one or more forecasting models to each time series contained in the preprocessed data to produce a forecast for the respective time series. For example, a model strategy 1112A can include an automatic modeling process in which analysis is performed on each time series in the preprocessed data to determine parameters (e.g., optimal or sub-optimal parameters) for one or forecasting models that are to be applied to that particular time series. The one or more forecasting models can then be tuned for and applied to each time series based on the determined parameters, thereby generating a forecast for that time series. Examples of the forecasting models include, but are not limited to, an autoregressive integrated moving average (ARIMA) model, an ARIMA model with exogenous variables (ARIMAX), an unobserved component model (UCM), an exponential smoothing model (ESM), intermittent-demand model (IDM), or any combination of these. Alternatively, some examples can involve model strategies 1112A with predefined configurations or settings (e.g., user-specified customizations or settings) for the one or more forecasting models, which can be applied to each time series to produce a corresponding forecast. In some examples, the model strategy 1112A can specify a single (e.g., comprehensive) forecasting model with which all the time series in the time-series data 1101 are to be modeled (e.g., simultaneously), rather than having a forecasting model specifically tuned for each individual time series.

In some examples, the model strategy 1112A can further involve analyzing the one or more forecasts for each time series to determine a champion forecast for each of the time series. In one example, for each time series, the forecasts generated by the one or more forecasting models in a model strategy are validated to determine a respective error statistic value or error metric. The forecasting model producing the lowest error statistic value is selected for that time series and the lowest error statistic value and the corresponding forecast are associated with that time series in the model strategy.

As one particular example, the model strategy operation 1104A can include three forecast models (e.g., as part of the model strategy 1112A) configured to produce Forecast 1, Forecast 2, and Forecast 3, respectively, for Time Series X in the time-series data 1101. The model strategy 1112A can also be configured to apply the same three forecast models, or a different set of forecast models, to produce Forecast 4, Forecast 5, and Forecast 6, respectively, for Time Series Y in the time-series data 1101. Once these forecasts are generated, the model strategy operation 1104A can be configured to analyze Forecasts 1-3 to determine a champion model for Time Series X and analyze Forecasts 4-6 to determine a champion model for Time Series Y. The analysis for Time Series X can be performed by calculating a performance metric (e.g., a forecast error) for each of the three forecasts and comparing the performance metrics against one another. Examples of the performance metric can include mean absolute percentage error (MAPE), mean absolute error (MAE), mean absolute scaled error (MASE), root-mean-square error (RMSE), or any combination of these. The forecasting model that generated the forecast with the best performance metric, such as the lowest error value, can be selected as the champion forecasting model for Time Series X. The analysis for Time Series Y can be performed similarly. A detailed example of determining a champion model for a time series contained in the time-series data 1101 is described later in the present application with regard to FIG. 12.

In some examples, the model strategy 1112A can include user-provided code that is defined in accordance with pre-defined rules for an application programming interface (API) of the pipeline system. The API can accept certain input parameters and provide corresponding outputs. The input parameters and/or outputs can be provided in any suitable format, such as JSON format. Results of the model strategy can be validated after execution to ensure compliance with the API.

The modeling strategies 1112A-C involved in the model strategy operations 1104A-C of the pipeline 1100 can be saved, retrieved, copied and edited for re-use in different pipelines for the time-series data 1101 or for different time-series data. For example, a user may specify, when generating the pipeline 1100, that a certain model strategy from another pipeline is to be used. In this way, the forecasting models contained in that model strategy as well as the configurations or settings for those forecasting models can be automatically loaded to the pipeline 1100. The user may further edit the model strategy 1112A by, for example, adding or removing forecasting models, changing configurations or settings of the forecasting models, or any combination of these.

The outputs of the different model strategy operations 1104A-C are then merged together and provided as input to the next operation of the pipeline 1100, which in the example shown in FIG. 11 is a strategy comparison operation 1106. In one example, the strategy comparison operation 1106 can involve analyzing performance metrics (e.g., forecast errors) associated with the forecasts generated by the model strategy operations 1104A-C. Based on this performance analysis, the strategy comparison operation 1106 can determine which model strategy among the multiple modeling strategies 1112A-C implemented in the model strategy operations 1104A-C is the champion model strategy for the time-series data 1101. The performance analysis is based on a higher-level comparison of performance metrics (e.g., forecast error distributions) associated with the modeling strategies 1112A-C, rather than a lower-level comparison of the performance statistics associated with the forecasting models applied to the time-series data 1101. One example of the performance metrics is shown in FIG. 12, as described below.

Figure 12:
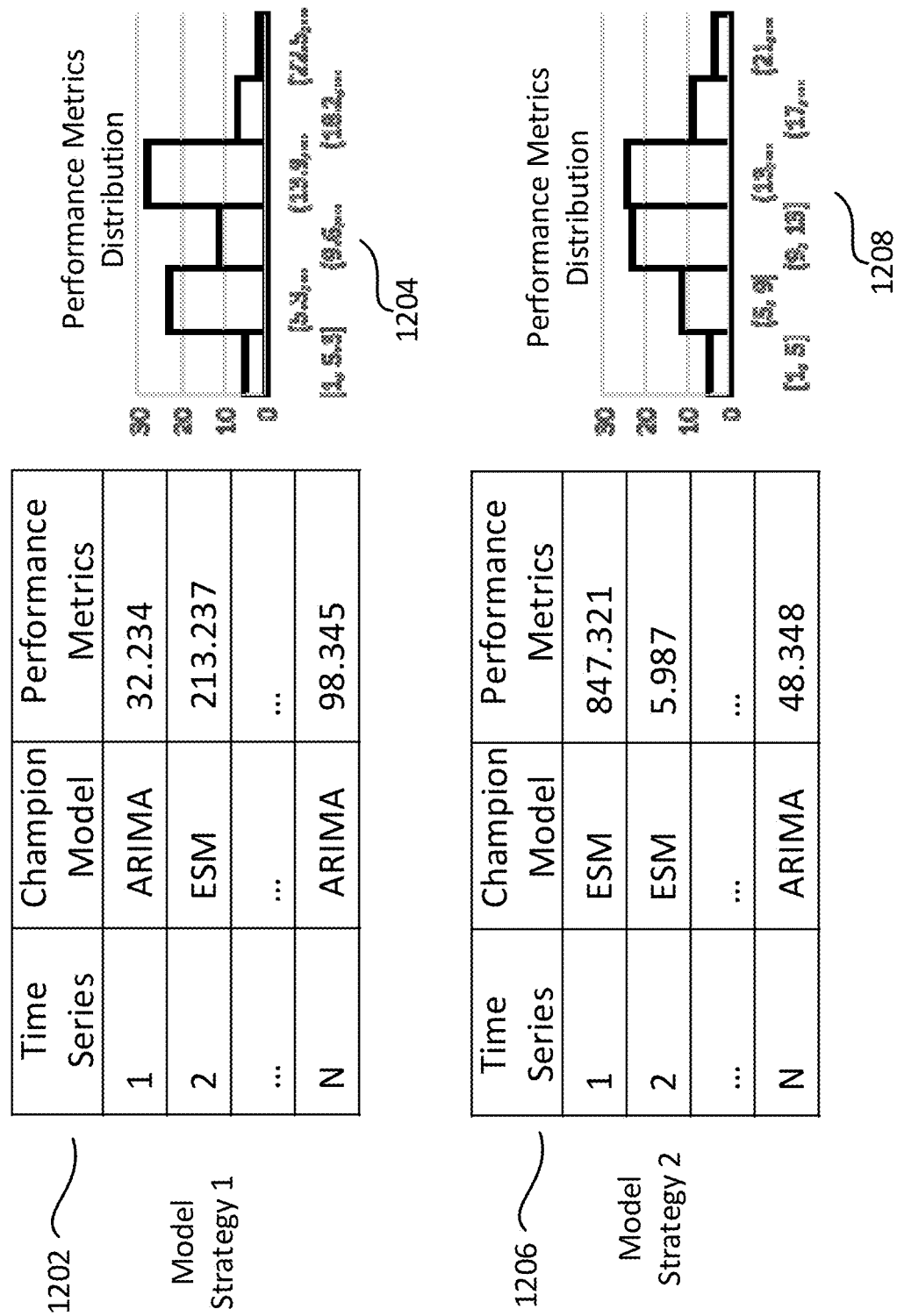
FIG. 12 is an example of comparing modeling strategies according to some aspects.

Referring now to FIG. 12, in this example, the performance metrics are for forecasts generated by two model strategies: Model Strategy 1 and Model Strategy 2. These two model strategies utilize different strategies to apply forecasting models on the time-series data 1101. Table 1202 lists the performance metrics for each time series in the time-series data 1101 using Model Strategy 1, and table 1206 lists the performance metrics for each time series in the time-series data 1101 using Model Strategy 2. Diagram 1204 is a bar chart showing a distribution of performance metrics over different time series in the time-series data 1101 using Model Strategy 1. Diagram 1208 is a bar chart showing a distribution of performance metrics over different time series in the time-series data 1101 using Model Strategy 2.

In some examples, Model Strategy 1 employs an automatic modeling process to determine parameters for forecasting models based on each of the multiple time series contained in the time-series data 1101. For instance, Model Strategy 1 can include 15 forecasting models, including both the ARIMA model and the ESM model. The parameters of these 15 forecasting models can be determined based on Time Series 2. These 15 forecasting models can then be tuned with the determined parameters and applied to the Time Series 2 to generate 15 forecasts for Time Series 2 (one forecast from each forecasting model). A performance metric (e.g., a forecast error) can then be calculated for each of the 15 forecasts and compared with one another. Examples of the performance metric can include mean absolute percentage error (MAPE), mean absolute error (MAE), mean absolute scaled error (MASE), root-mean-square error (RMSE), or any combination of these. The forecasting model that generated the forecast with the best performance metric, such as the lowest error value, is selected as the champion forecasting model for Time Series 2. For example, if the ESM model generated a forecast with the best performance metric, the ESM model can thus be selected as the champion forecasting model for Time Series 2 in Model Strategy 1, as shown in Table 1202. This process can be repeated for all of the time series in the time-series data 1101 to produce the Table 1202.

Once the performance metrics for all the champion models in the Table 1202 are determined, a performance metric distribution 1204 (e.g., an error distribution) can be generated for Model Strategy 1. The performance metric distribution 1204 is a distribution of the performance metrics for some or all of the champion models in Model Strategy 1. A similar process can be utilized to generate the Table 1206 and the performance metric distribution 1208 for Model Strategy 2.

The strategy comparison operation 1106 can then compare the performance metric distributions (e.g., performance distributions 1204, 1208) for the various modeling strategies (e.g., Model Strategy 1 vs. Model Strategy 2) to determine the champion model strategy for the time-series data 1101. For example, a combined (e.g., mean, median, or aggregate) statistical value can be calculated for each performance metric distribution and compared to the other combined statistical values associated with the other performance metric distributions to determine the champion model strategy. As one particular example, an aggregate error can be determined for each of the modeling strategies and the model strategy having the smallest aggregate error can be selected as the champion model strategy. Examples of the aggregate error include a weighted mean absolute percentage error (WMAPE), the weighted mean absolute error (WMAE), weighted mean absolute scaled error (WMASE), weighted root-mean-square error (WRMSE), weighted average percent error (WAPE), or any combination of these.

Referring back to FIG. 11, the sequence of operations of the pipeline 1100 next includes the output operation 1108. In some examples, the output operation 1108 involves determining champion forecasts 1110 for the time-series data 1101. For example, the output operation 1108 can involve assigning the forecasts generated by the champion model strategy as the champion forecasts 1110. Additionally or alternatively, the output operation 1108 can involve re-applying the champion model strategy to the preprocessed data to generate the champion forecasts 1110. In some examples, the output operation 1108 can include any number and combination of operations for outputting any of the data generated by the pipeline 1100 requested by a user.

While the pipeline 1100 in FIG. 11 is illustrative, other pipelines can include more operations, fewer operations, different operations, or a different sequence of the operations shown in FIG. 11. And some or all of the operations (e.g., the model strategy operations 1104) can be executed in parallel in a distributed computing environment.

Figure 13:
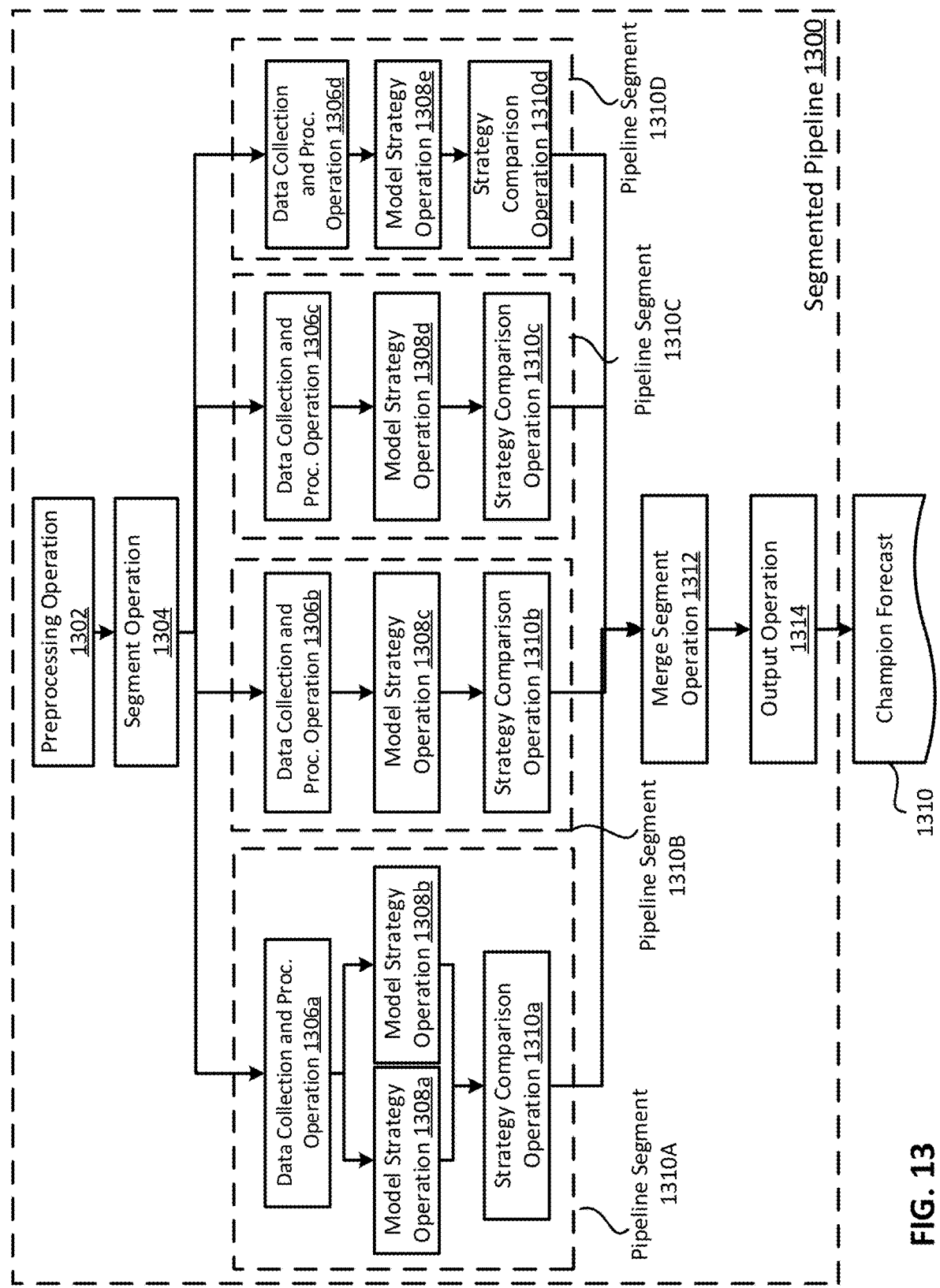
FIG. 13 is an example of a segmented pipeline usable for determining a forecast according to some aspects.

FIG. 13 illustrates an example of a segmented pipeline 1300 configured to generate one or more forecasts for time-series data according to some aspects. A segmented pipeline 1300 is a pipeline that has segments (e.g., branches) configured to be executed in parallel. The time-series data can be similar to the time-series data 1101 described above with regard to FIG. 11.

The segmented pipeline can also be defined in a file, such as a JSON file, with code indicating the sequence of operations to be executed for the segmented pipeline. FIG. 13 shows an exemplary sequence of operations that are involved in the segmented pipeline 1300. Similar to the pipeline 1100, the segmented pipeline 1300 includes a pre-processing operation 1302 which can be implemented similarly as the preprocessing operation 1102 described above with regard to FIG. 11. For example, the preprocessing operation 1302 can preprocess the time-series data to, for example, normalize, clean, add, remove, or reformat the time-series data.

The sequence of operations included in the segmented pipeline 1300 further includes a segment operation 1304 involving splitting the time-series data up into data segments (groups) that can be operated on in parallel. Each data segment has a common characteristic. For example, the segment operation 1304 can split up the time-series data into data segments by type, source, quantity, associated entities, or any combination of these. In some examples, the segment operation 1304 involves analyzing metadata (e.g., an indicator or a flag) associated with each of the time series in the time-series data to determine an appropriate data segment for the time series. In another example, the segment operation 1304 involves determining the data segments using other mechanisms, such as based on the analysis of the nature of the time series contained in the time-series data.

Each of the data segments can be assigned to its own pipeline segment (e.g., branch) and operated on in parallel to the data segments. For example, each of the pipeline segments 1310 corresponds to one of the data segments and can include a group of operations. The group of operations can include a data collection and processing operation 1306, one or more model strategy operations 1308, and a strategy comparison operation 1310.

The data collection and processing operations 1306a-d can each involve collecting data for a data segment that corresponds to the pipeline segment 1310. The data collection and processing operations 1306a-d can also each involve preparing the data segment so that it can be processed by the corresponding pipeline segment 1310. The data collection and processing operations 1306a-d can additionally or alternatively involve other processing operations, such as processing the corresponding data segment to make them suitable for the modeling strategies contained in a pipeline segment, or further dividing the data segments into groups so that different forecasting models in the pipeline segment can be properly applied.

The model strategy operations 1306 and the strategy comparison operations 1310 contained in the pipeline segments 1310 can be implemented similarly to the model strategy operation 1104 and the strategy comparison operation 1106, respectively, as described above. One of the differences is that a model strategy operation 1306 applies the model strategy to its corresponding data segment, rather than the entire input time-series data, to generate forecasts. Likewise, the strategy comparison module 1310 analyzes performance metrics associated with the forecasts and determine a champion model strategy for the corresponding data segment.

The sequence of operations in the segmented pipeline 1300 further includes a merge segment operation 1312, in which the forecasts generated by the pipeline segments 1310 are merged together to generate the final forecast for the input time-series data. The merging can include interleaving, concatenation, or both. The merge segment operation 1312 may further place the forecasts in a format that is the same as the input time-series data or as specified by the user requesting the forecast. The sequence of operations can also include an output operation 1314, which can be similar to the output operation 1108 described with regard to FIG. 11 (e.g., to determine a champion forecast 1310 for the input time-series data).

Figure 14:
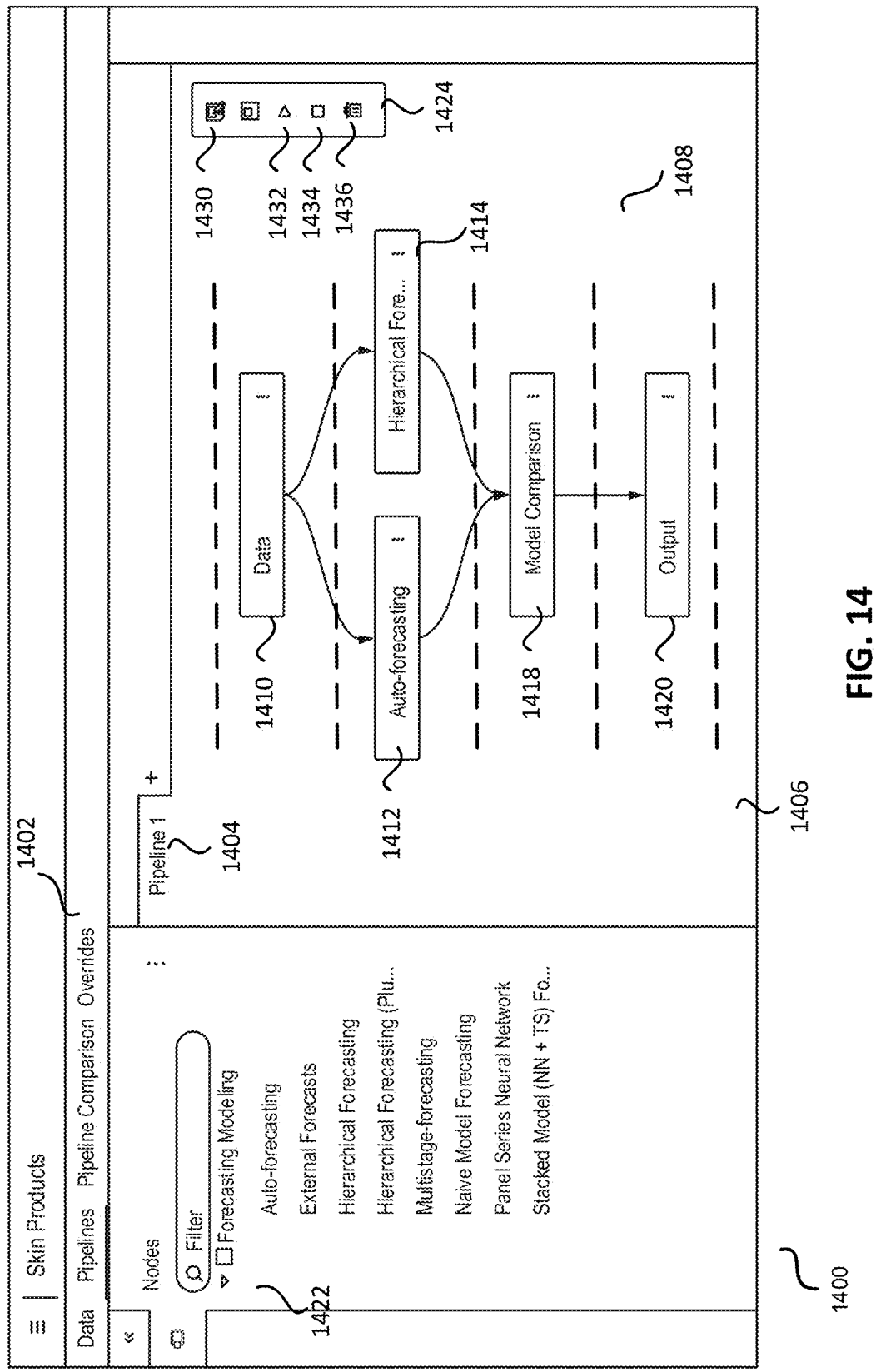
FIG. 14 is an example of a graphical user interface for generating a pipeline for time-series data according to some aspects.
Figure 16:
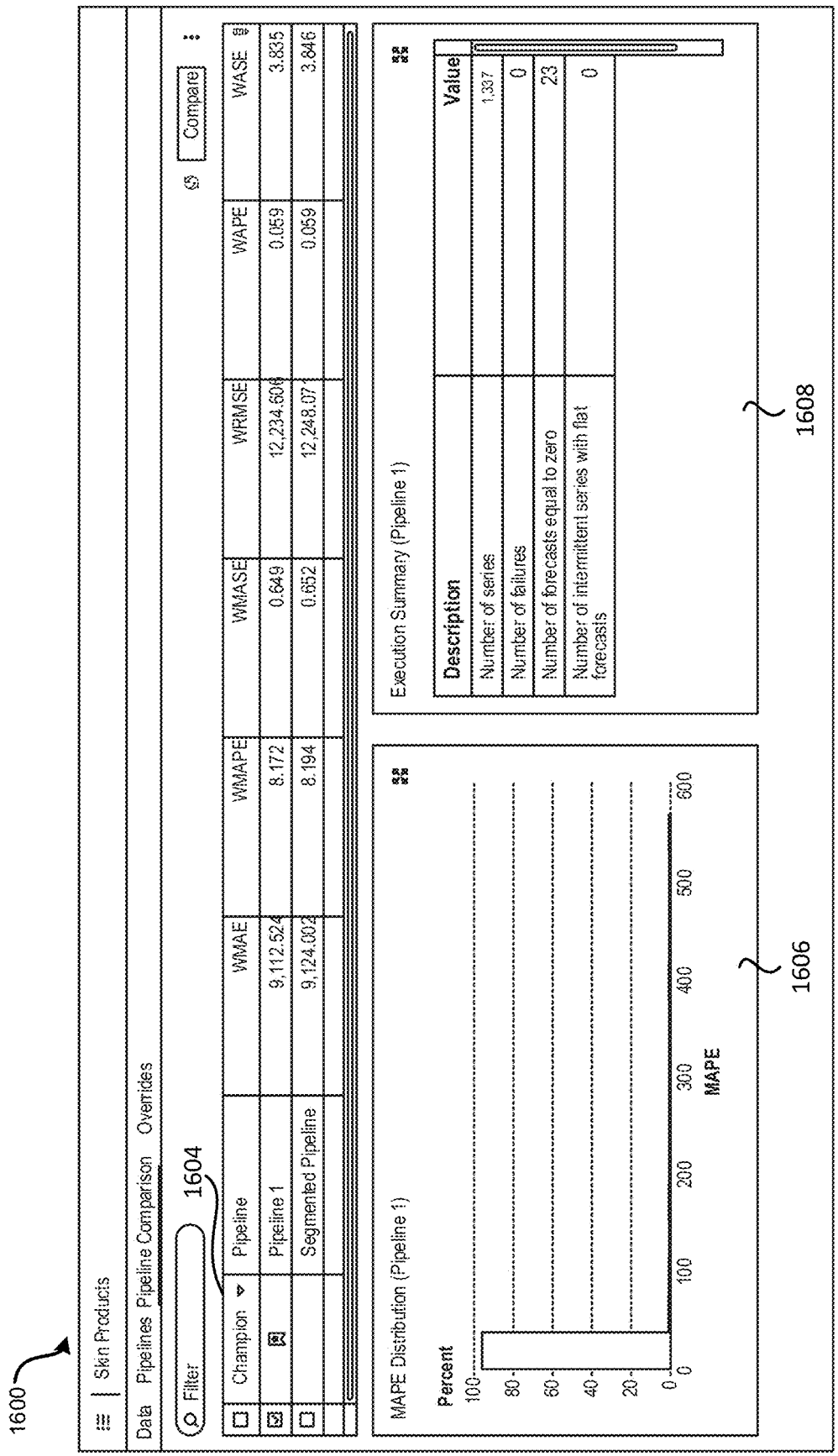
FIG. 16 is an example of a graphical user interface for determining a champion pipeline according to some aspects.

FIG. 14 is an example of a graphical user interface (GUI) 1400 for generating a pipeline for time-series data according to some aspects. The GUI 1400 includes a group of user interface controls 1402 that can be utilized to control the operations in different stages of the forecasting process. The user interface control 1402 includes a "Data" tab, a "Pipeline" tab, a "Pipeline Comparison" tab, and an "Overrides" tab. The "Data" tab can be selected to display a user interface (not shown in FIG. 14) for specifying input time-series data for the forecast process. The "Pipeline" tab can be used to build one or more pipelines for the input time-series data. The "Pipeline Comparison" tab can be used to compare the pipelines used in the forecast to determine a champion pipeline for the time-series data. An example of the "Pipeline Comparison" tab is shown in FIG. 16 and discussed in greater detail later on in this disclosure. The "Override" tab allows a user to override the champion forecast that was generated by the champion pipeline.

The user interface shown in FIG. 14 illustrates a "Pipeline" tab 1404. In this example, the tab 104 includes a pipeline window 1406 where the graphical visualization 1408 of the pipeline 1100 discussed above with regard to FIG. 11 is displayed. The graphical visualization 1408 includes a swim lane diagram with a series of distinct lanes (e.g., as indicated by horizontal dashed lines) spatially positioned adjacent to one another. One lane is for depicting pre-processing operations including the operation node 1410; one lane for depicting model strategy operations including the operation nodes 1412 and 1414; one lane for depicting comparison operations including the operation node 1416, and one lane for depicting post-processing operations including the output node 1420. Each of the operation nodes 1410-1420 corresponds to an operation in the pipeline 1100, such that the graphical visualization 13408 is spatially organized in an order in which the sequence of operations is executed in the pipeline 1100. The pipeline window 1406 further includes a panel 1422 where a library of modeling strategies are displayed. From the library of modeling strategies, a user can select a model strategy to be added to the pipeline 1100.

Adding a model strategy to the pipeline 1100 can be performed by dragging and dropping the icon corresponding to the selected model strategy from the panel 1422 to a proper position of the graphical visualization 1408, such as after the data operation node 1410. Upon dropping the selected model strategy at the proper position, an operation node corresponding to the model strategy can be automatically added to the graphical visualization 1408 and appropriate connections (e.g., a connection from the data operation node 1410 to the operation node and a connection from the operation node to the model comparison operation node 1418) are also automatically added to the graphical visualization 1408. The pipeline 1100 can be updated accordingly to include the newly added operation and the connections.

If the newly added model strategy is the first model strategy in the pipeline, the output operation node 1420 is also added automatically along with the model strategy operation node corresponding to the newly added model strategy. If a second model strategy is added in the pipeline, a model comparison operation node 1418 and any connections between the model comparison operation node 1418 and other nodes in the pipeline are automatically added along with a model strategy operation node for the second model strategy. Likewise, if an existing model strategy operation node is removed, any connections associated with the model strategy operation node are also removed. If the removed model strategy operation node is the last model strategy operation node in the pipeline 1100, the model comparison operation node 1418, the output operation node 1420 and any connections between them are also automatically removed. The pipeline 1100 is also updated accordingly, such as by modifying the JSON file describing the pipeline 1100 based on the changes to the graphical visualization 1408.

Although the above example focuses on a model comparison operation node 1418, the automatic addition or deletion of related nodes can also be applied to other types of nodes. When a user adds an operation into the pipeline, other operations may also be automatically added to (or removed from) the pipeline according to predefined rules. The predefined rules can define required operations for a given operation. For example, the predefined rules can define an output operation as a required operation for a model strategy operation and a data operation. As another example, the predefined rules can define a model comparison operation as a required operation for multiple model strategy operations, but not for a single model strategy operation. Based on these rules, required operations can be automatically added to the pipeline when a particular operation is added by the user. The graphical visualization of the pipeline may also be automatically updated to include visual representations of these additional required operations, such as the nodes shown in the GUI 1400, along with any suitable connections between adjacent operations in the pipeline.

Likewise, various operations that become extraneous when an existing operation is removed from the pipeline. So, the extraneous operations can be automatically removed from the pipeline, in accordance with the predefined rules. The graphical visualization of the pipeline may also be automatically updated to remove visual representations of the existing operation and any other extraneous operations.

The GUI 1400 further shows a group of control buttons 1424 that can be utilized to control the pipeline 1100 represented by the graphical visualization 1408. For instance, a user can save or delete the pipe 1100 by clicking on or otherwise activate the "save" icon 1430 or the "delete" icon 1436, respectively. The user can also execute or stop the execution of the pipeline by clicking on or otherwise activate the "play" icon 1432 or the "stop" icon 1434, respectively.

Figure 15:
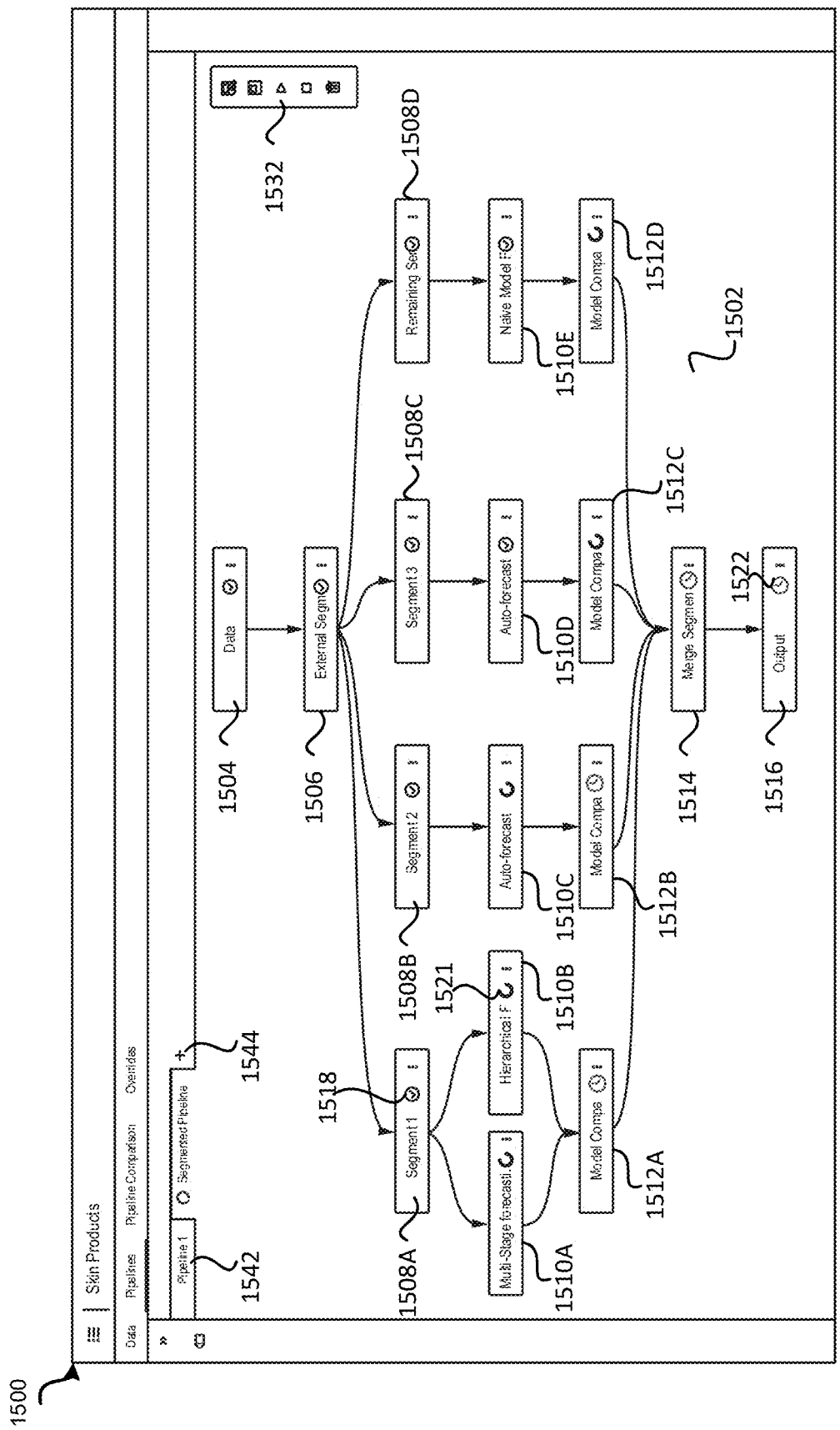
FIG. 15 is an example of a graphical user interface for executing a segmented pipeline according to some aspects.

FIG. 15 shows an example of a GUI 1500 containing a graphical visualization of the segmented pipeline 1300 discussed above with regard to FIG. 13 and for executing the segmented pipeline 1300 according to some aspects. In the GUI 1500, the graphical visualization 1502 of the segmented pipeline 1300 is shown to include an operation node for each operation included in the segmented pipeline 1300, such as the operation node 1504 for the preprocessing operation, the operation node 1506 for the segment operation, the operation nodes 1508A-1508D for the segment data operations, the operation nodes 1510A-1510E for the model strategy operations, the operation nodes 1512A-1512D for the strategy comparison operations, the operation node 1514 for the merge segment operation and the operation node 1516 for the output operation.

The segmented pipeline 1300 can be executed by activating the "play" icon 1532. The status of the execution of each operation can be shown via the corresponding operation node. In the example GUI shown in FIG. 15, the operation nodes 1504, 1506, 1508A-D and 1510D show that the corresponding operations are completed by showing a check icon 1518. Other operations nodes, such as nodes 1510A-C are showing as being currently executed via an icon 1521, whereas the remaining nodes, such as nodes 1512A-B, 1514, and 1516 are shown as waiting to be executed by displaying an icon 1522. While FIG. 15 illustrates certain icons are used to indicate the execution status of the respective operations of a pipeline, other icons or other types of indications can be utilized to show the execution status of a pipeline.

Further, as shown in FIG. 15, the segmented pipeline 1300 illustrated through the graphical visualization 1502 is the second pipeline for the input time-series data. The first pipeline is visualized in the tab 1542. Additional pipelines can be added for the time-series data by activating the user interface control 1544. These pipelines collectively define a project. In other words, a project can include multiple pipelines, each of which can be configured and executed separately (or simultaneously) in a distributed computing environment. After the execution of all the pipelines is complete, some or all of the pipelines can be compared. For example, a champion forecast generated by one pipeline based on input time-series data can be compared to another champion forecast generated by another pipeline based on the same input time-series data. The comparison results can be shown in a "Pipeline Comparison" user interface. An example of the "Pipeline Comparison" user interface 1600 is shown in FIG. 16, described below.

A champion pipeline can be determined from among the multiple pipelines in a project, e.g., by determining the pipeline having the smallest aggregate error. A marker or other visual indicator can then be depicted, in the "Pipeline Comparison" user interface 1600, proximate to the champion pipeline to indicate that it is the champion pipeline. Similarly, multiple projects can also be established and compared. For example, multiple projects can be compared by comparing the pipelines within the projects. A champion pipeline can be determined for each of the multiple projects. The champion pipelines for these projects can be compared with one another to determine the champion project, which may be the project containing the champion pipeline having the smallest aggregate error.

Although the above description focuses on a user manually creating a pipeline in the GUI 1400 or 1500, a pipeline or a portion there of may be automatically generated based on a rule set. For example, a user can specify high level parameters that the user wants in the pipeline, such as the number of segments, the number of model strategies, the default model strategies to be included in the pipeline, or a combination thereof. Based on the ruleset, the computing device can automatically generate the pipeline and its association graphical visualization.

Referring now to FIG. 16, in the example user interface 1600, two pipelines are compared by showing a table summarizing metrics (e.g., WMAE, WMAPE, WMASE, WRMSE, WAPE, and the WASE) calculated based on the pipelines. Based on these metrics, a champion pipeline is selected and indicated in the field 1604. In addition, the user interface 1600 can also show the distribution of the metrics of the champion pipeline (e.g. via a window 1606) and the execution summary of the champion pipeline (e.g. via a summary window 1608). Based on the information provided in the user interface 1600, a user can determine whether to keep the champion pipeline, or to override the champion pipeline by selecting another pipeline as the champion pipeline. Either way, the resulting champion pipeline may then be used to generate one or more forecasts for the input time-series data. In some examples, the processing device also presents a GUI for setting champion selection criteria. This GUI allows users to specify or change the default metric, such as the WMAPE metric to other metrics for the project. Other criteria for selecting the champing pipeline can also be specified in this GUI.

Figure 17:
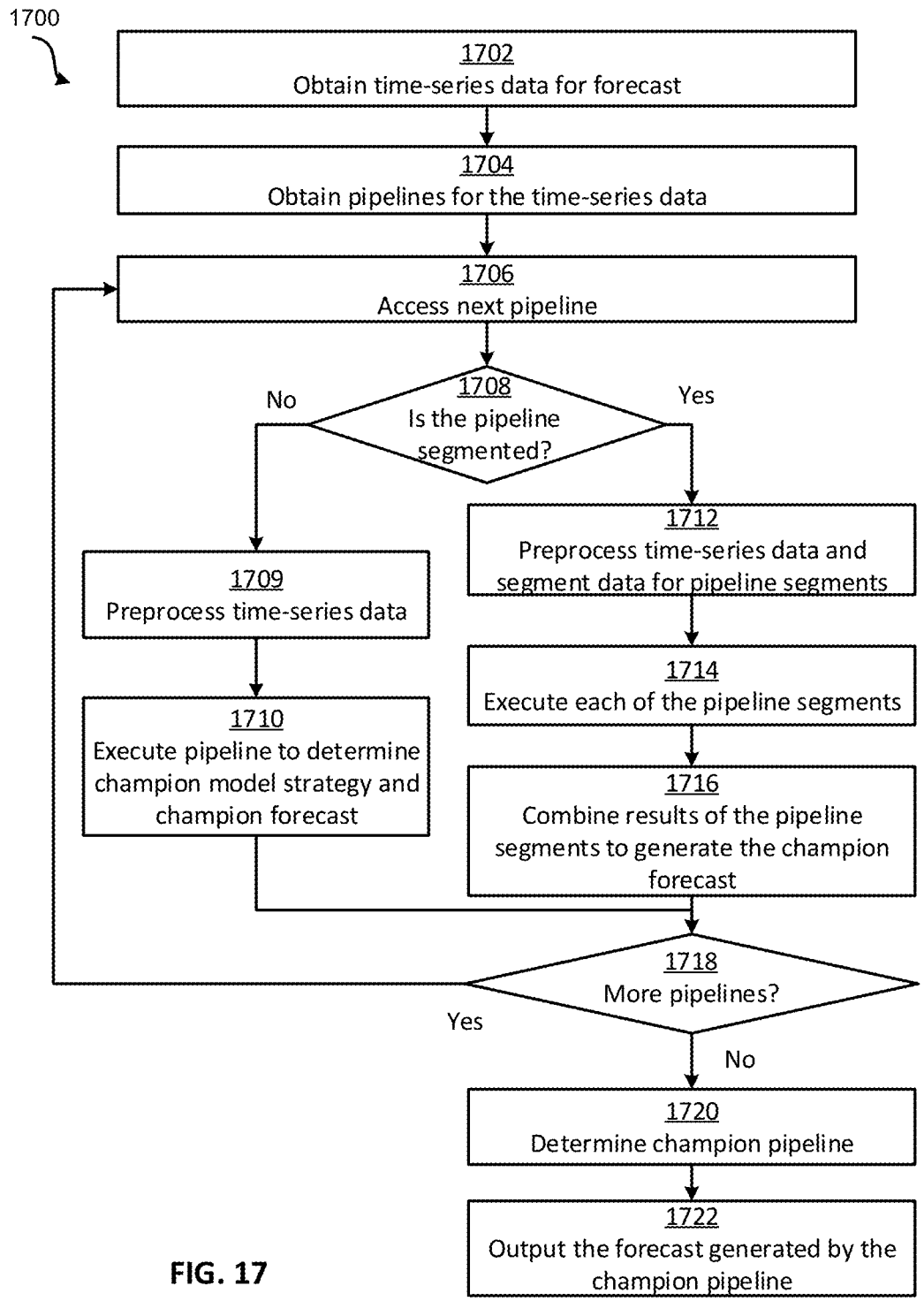
FIG. 17 is a flow chart of an example of a process for determining a forecast for time-series data based on pipelines according to some aspects.

FIG. 17 is a flow chart of an example of a process 1700 for determining forecasts for time-series data based on forecast pipelines in a forecasting software environment according to some aspects. Some examples can include more steps than, fewer steps than, different steps than, or a different order of the steps shown in FIG. 17. Some examples can be implemented using any of the systems and processes described with respect to FIGS. 1-10.

In block 1702, a processing device obtains time-series data for forecast. The time-series data can include multiple time series. The time-series data can be provided by a client device or be collected by the processing device from one or more third-party devices, such as being downloaded from one or more cloud computing servers or from a distributed network configured for measuring or otherwise collecting the time-series data.

In block 1704, the processing device obtains one or more pipelines describing a sequence of operations for processing the time-series data to produce one or more forecasts. In one example, the pipelines are generated based on inputs sent from a client device. For example, the processing device can generate a GUI, such as the GUIs 1500-1600, and have the GUI presented on the client device. A user of the client device can operate in the GUI to build the pipelines, execute the pipelines, view the forecasts or perform any combination of these operations. In another example, the processing device can obtain the pipelines by accessing files defining existing pipelines that are used for other time-series data and importing the files into the current forecasting software environment.

In block 1706, the processing device accesses one of the pipelines for evaluation. This pipeline is referred to below as the "current pipeline," since this is the pipeline to be currently evaluated and executed.

In block 1708, the processing device determines whether the current pipeline is a segmented pipeline. As discussed above, a segmented pipeline includes multiple pipeline segments (e.g., branches) each configured to perform the forecasting for a particular segment of the time-series data.

If the current pipeline is not a segmented pipeline, in block 1709, the processing device performs the preprocessing operation of the pipeline to preprocess the time-series data, such as to clean, add, remove, or re-format the time-series data.

In block 1710, the processing device executes the pipeline. This may involve executing one or more model strategy operations on the preprocessed data as defined in the pipeline. The processing device may compare the results of the model strategy operations to determine a champion model strategy and a champion forecast. Additional examples of the processing device executing the pipeline are described below with regard to FIG. 18.

If the current pipeline is a segmented pipeline, the process 1700 proceeds to block 1712. In block 1712, the processing device preprocesses the time-series data, for example, as described above in relation to block 1709. In addition, the processing device divides the time-series data into data segments that correspond to the pipeline's segments.

In block 1714, the processing device executes each of the pipeline segments by applying the operation(s) in each respective pipeline segment to the corresponding data segment, such as by applying modeling strategies on the data segment and comparing the results of the modeling strategies. In some examples, executing the pipeline segments may involve implementing the process described later on in this disclosure with regard to FIG. 18.

In block 1716, the processing device combines the results of the pipeline segments to generate a champion forecast for the segmented pipeline.

In block 1718, the processing device determines whether there are more pipelines for the time-series data. If so, the processing device accesses the next pipeline for evaluation and repeats steps 1708-1718 for the next pipeline.

Once there are no more pipelines to be evaluated, the process 1700 proceeds to block 1720. In block 1720, the processing device determines a champion pipeline (assuming that there are multiple pipelines for the time-series data). As discussed in detail above, the comparison can be performed by comparing distributions of performance metrics between the pipelines. Based on the distribution comparison, the processing device can select a champion pipeline.

In some examples, the processing device may further receive an override instruction from a user to instead use another pipeline as the champion pipeline, rather than the system-designated champion pipeline. Subsequent to receiving the override instruction, the processing device can specify the other pipeline as the champion pipeline for the time-series data.

In block 1722, the processing device generates forecasts for the time-series data using the champion pipeline determined in block 1720.

It should be understood that while the above describes that the pipelines are processed one after another, the pipelines can be processed in parallel in a distributed computing environment. Furthermore, while the above describes that a processing device performs the various operations involved in the process 1700, the phrase "a processing device" as used herein is intended to encompass one processing device or multiple processing devices. Any number and combination of processing devices can work in concert to implement the examples described herein.

Figure 18:
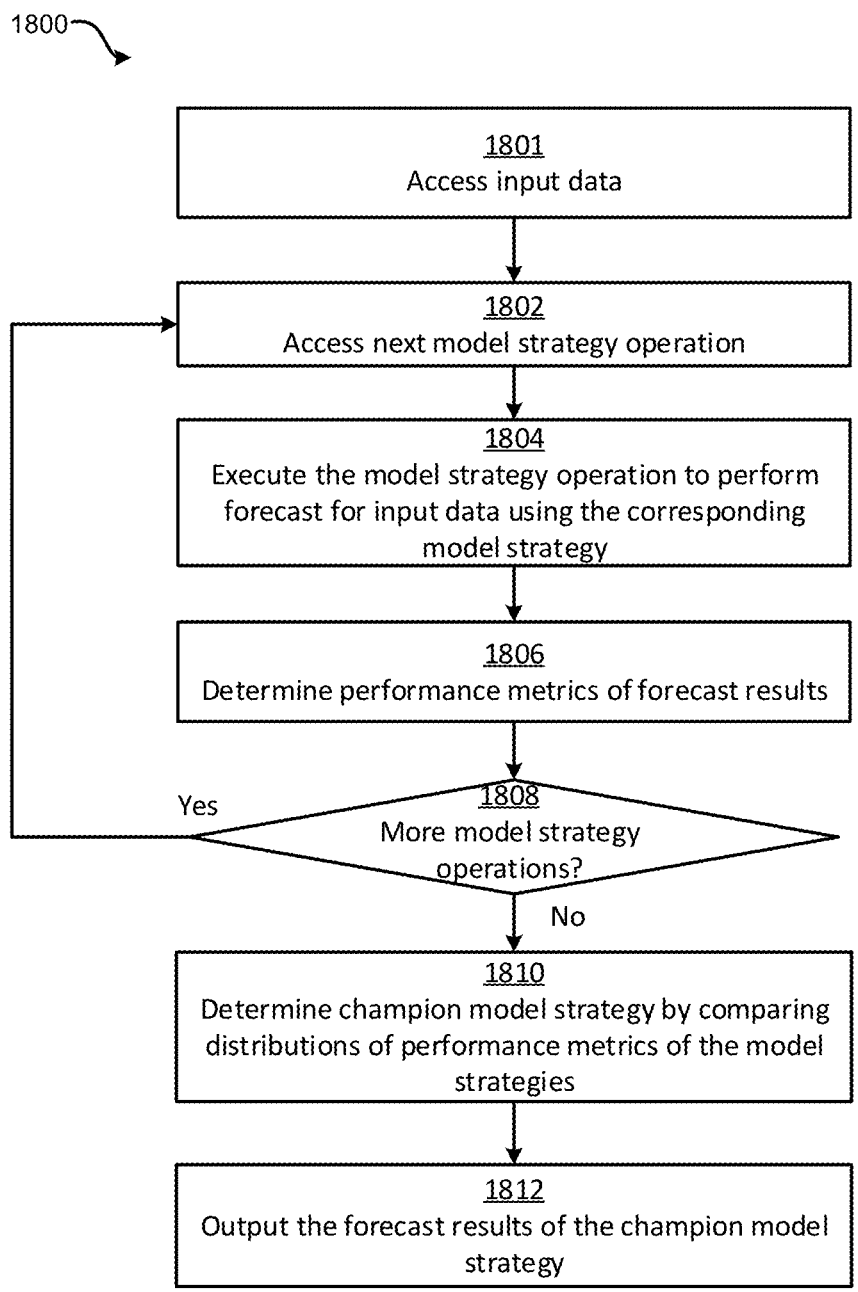
FIG. 18 is a flow chart of an example of a process for executing a pipeline to determine a champion model strategy and a champion forecast for time-series data according to some aspects.

FIG. 18 illustrates a flow chart of an example of a process 1800 for executing a pipeline or a pipeline segment to determine a champion model strategy and champion forecast for input time-series data according to some aspects. Some examples can include more steps than, fewer steps than, different steps than, or a different order of the steps shown in FIG. 18. Some examples can be implemented using any of the systems and processes described with respect to FIGS. 1-10.

In block 1801, a processing device accesses input time-series data. If the process 1800 is performed for a pipeline segment, the input time-series data contains the data segment that is generated for this pipeline segment, such as the data segment generated in block 1712 of FIG. 17. If the process 1800 is performed for a pipeline, the input time-series data contains the multiple time series for the pipeline, such as the preprocessed data generated in block 1709 of FIG. 17.

In block 1802, the processing device accesses the next model strategy operation contained in the pipeline or pipeline segment.

In block 1804, the processing device executes the model strategy operation, which may include one or more model strategies. One exemplary model strategy can include an automatic modeling process in which the input time-series data are analyzed to generate forecasting models for the time-series data. Another exemplary model strategy can include a single comprehensive forecasting model in which all the time series in the time-series data are modeled simultaneously. Another exemplary model strategy can include user-provided code rather than using existing forecasting models. The user-provided code may be defined in accordance with an existing API or "contract." In some examples, the user-provided code may include forecast values explicitly provided by the user, in which case no additional forecasting need to be performed for the time-series data. Execution of the model strategy operation can involve generating at least one forecast for each of the time series contained in the input time-series data.

In block 1806, the processing device determines the performance metrics of the forecast results generated by the model strategy, such as the forecast errors measured by MAPE, MAE, MASE, or RMSE.

In block 1808, the processing device determines whether there are more model strategy operations to be performed for the pipeline or pipeline segment. If so, the next model strategy operation is accessed in block 1802 and steps 1084-1808 are repeated for the next model strategy operation.

Once all the modeling strategies for the pipeline or pipeline segments have been executed, the process 1800 can proceed to block 1810. In block 1810, the processing device executes a strategy comparison operation to determine a champion model strategy and/or a champion forecast for the time-series data. The comparison is performed by comparing the distributions of performance metrics for the modeling strategies, such as by calculating and comparing aggregate error values based on the error distributions of the modeling strategies.

In block 1812, the processing device outputs the forecast generated by the champion model strategy as the champion forecast for the input time-series data.

Figure 19:
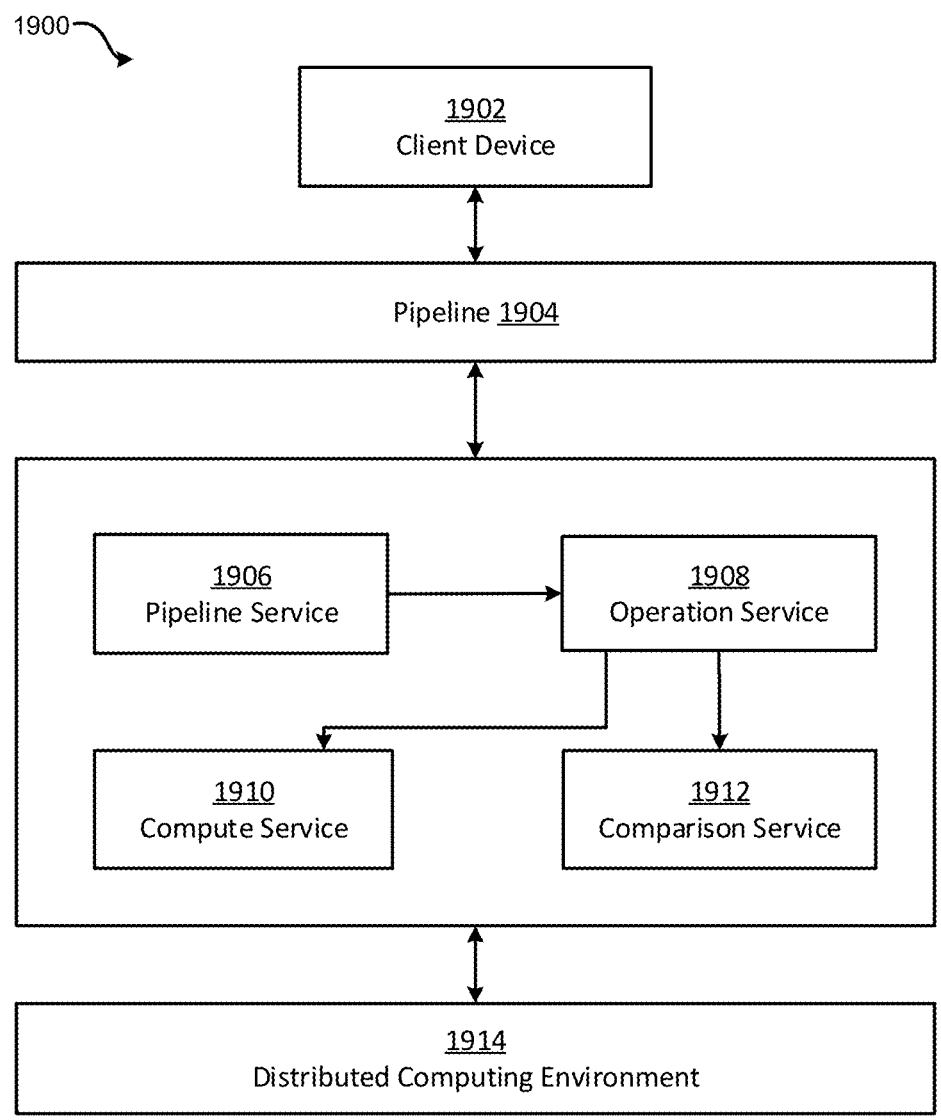
FIG. 19 is a block diagram of an example of a system for executing a pipeline according to some aspects.

FIG. 19 shows a block diagram of an example of a system 1900 for executing a pipeline according to some aspects. In the system 1900, a user can define a pipeline 1904 via a client device 1902. The pipeline 1904 can be defined as a sequence of operations that are supported by a group of microservices 1906-1912. The execution of the sequence of operations involves invoking some or all of the microservices 106-1912. For example, when executing a pipeline 1904, the pipeline service 1906 is invoked to load the operations of the pipeline and connections between the operations. The pipeline service 1906 can further coordinate the execution of the operations in the pipeline based on the connection between the operations and map the output data from one operation to the next operation.

In order to manage or coordinate the operations, the pipeline service 1906 can invoke the operation service 1908 for each operation of the pipeline. The operation service 1908 load the parameters and code for the corresponding operation and invoke other microservices that can be utilized to execute the operation, such as the compute service 1910 and the comparison service 1912. The compute service 1910 can execute the code implementing the corresponding operation in the forecasting software environment to generate output results, such as executing the model strategy operations. After the computing service 1912 finishes the respective execution, the operation service 1908 further invokes the comparison service 1912 to compare the sets of the forecasts generated. The comparison service 1912 can be invoked to determine the champion model strategy or the champion pipeline. The various microservices described above can be executed in a distributed computing environment 1914. While FIG. 19 depicts one exemplary implementation using microservices, other implementations are possible involving any number, configuration, and types of services or applications.

In the previous description, for the purposes of explanation, specific details are set forth in order to provide a thorough understanding of examples of the technology. But various examples can be practiced without these specific details. The figures and description are not intended to be restrictive.

The previous description provides examples that are not intended to limit the scope, applicability, or configuration of the disclosure. Rather, the previous description of the examples provides those skilled in the art with an enabling description for implementing an example. Various changes may be made in the function and arrangement of elements without departing from the spirit and scope of the technology as set forth in the appended claims.

Specific details are given in the previous description to provide a thorough understanding of the examples. But the examples may be practiced without these specific details. For example, circuits, systems, networks, processes, and other components can be shown as components in block diagram form to prevent obscuring the examples in unnecessary detail. In other examples, well-known circuits, processes, algorithms, structures, and techniques may be shown without unnecessary detail in order to avoid obscuring the examples.

Also, individual examples may have been described as a process that is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. And a process can have more or fewer operations than are depicted in a figure. A process can correspond to a method, a function, a procedure, a subroutine, a subprogram, etc. When a process corresponds to a function, its termination can correspond to a return of the function to the calling function or the main function.

Systems depicted in some of the figures can be provided in various configurations. In some examples, the systems can be configured as a distributed system where one or more components of the system are distributed across one or more networks in a cloud computing system.

The invention claimed is:

1. A system comprising:
 a processing device; and
 a memory device comprising instructions that are executable by the processing device for causing the processing device to:
  access a pipeline for forecasting a plurality of time series, the pipeline representing a sequence of operations for processing the plurality of time series to produce forecasts, wherein the sequence of operations includes:
   (i) model strategy operations for applying model strategies to the plurality of time series to determine error distributions corresponding to the model strategies, wherein each of the model strategies is configured to:
receive the plurality of time series;
determine champion forecasts for the plurality of time series by, for each time series among the plurality of time series:
generating respective forecasts for the time series by applying forecasting models to the time series; and
determining a respective champion forecast for the time series by comparing error metrics associated with the respective forecasts;
determine error values associated with the champion forecasts, each of the error values indicating the accuracy of a respective champion forecast among the champion forecasts; and
generate one of the error distributions using the error values; and
(ii) a model-strategy comparison operation configured to:
receive the error distributions corresponding to the model strategies;
determine aggregate error values associated with the model strategies based on the error distributions, each aggregate error value being associated with one of the model strategies and being determined by aggregating the error values in one of the error distributions; and
determine which of the model strategies is a champion model strategy for the plurality of time series by comparing the aggregate error values to one another; and
execute the pipeline to determine the champion model strategy for the plurality of time series.

2. The system of claim 1, wherein the model strategies are defined in shareable files to enable importation of the model strategies into another pipeline for execution.

3. The system of claim 1, wherein the pipeline is programmatically generated according to user preferences within a forecasting software environment.

4. The system of claim 1, wherein the pipeline includes:
a plurality of pipeline segments for executing a plurality of operation groups in parallel;
a segmentation operation prior to the plurality of pipeline segments for dividing the plurality of time series into a plurality of data segments, each data segment among the plurality of data segments being destined for a respective pipeline segment among the plurality of pipeline segments; and
a merge segment operation subsequent to the pipeline segments for combining results from the plurality of pipeline segments.

5. The system of claim 1, wherein the memory device further comprises instructions that are executable by the processing device for causing the processing device to determine a champion pipeline for a project by comparing a first pipeline in the project to a second pipeline in the project.

6. The system of claim 5, wherein the memory device further includes instructions that are executable by the processing device for causing the processing device to:
determine the champion pipeline for the project by comparing (i) a first champion forecast generated by the first pipeline based on the plurality of time series, to (ii) a second champion forecast generated by the second pipeline based on the plurality of time series; and
include a graphical object in a graphical user interface to indicate that the first pipeline is the champion pipeline.

7. The system of claim 6, wherein the memory device further includes instructions that are executable by the processing device for causing the processing device to:
receive an override instruction to use the second pipeline rather than the champion pipeline to forecast the plurality of time series; and
subsequent to receiving the override instruction, generate one or more forecasts for the plurality of time series using the second pipeline rather than the champion pipeline.

8. The system of claim 1, wherein:
the pipeline is defined in a file that is a shareable with other users and formatted to enable the other users to import the pipeline into a forecasting software environment and execute the pipeline;
accessing the pipeline comprises loading the file of the pipeline into the forecasting software environment; and
executing the pipeline comprises executing the pipeline in the forecasting software environment.

9. The system of claim 1, wherein the memory device further includes instructions that are executable by the processing device for causing the processing device to:
include a graphical visualization of the pipeline in a graphical user interface, the graphical visualization including visual representations of each operation among the sequence of operations spatially organized in an order in which the sequence of operations is executed in the pipeline.

10. The system of claim 9, wherein the graphical visualization includes a swim lane diagram with a series of distinct lanes spatially positioned adjacent to one another, the lanes including:
a first lane for depicting pre-processing operations;
a second lane for depicting model strategy operations;
a third lane for depicting comparison operations; and
a fourth lane for depicting post-processing operations,
wherein each lane has a visual representation of an operation in the pipeline connected to another visual representation of another operation in the pipeline depicted in another lane.

11. The system of claim 9, wherein the memory device further comprises instructions that are executable by the processing device for causing the processing device to:
detect a user input involving adding an operation to the pipeline; and
based on the user input, automatically add another operation into the pipeline or remove the other operation from the pipeline in accordance with predefined rules.

12. The system of claim 11, wherein the operation is a model strategy operation, and wherein the memory device further comprises instructions that are executable by the processing device for causing the processing device to:
automatically add the other operation to the pipeline, the other operation being a required operation according to the predefined rules; and
automatically update the graphical visualization of the pipeline to include (i) a visual representation of the other operation, and (ii) a visual representation of the model strategy operation with a visual connection to another visual representation of at least one other operation among the sequence of operations.

13. The system of claim 9, wherein the memory device further comprises instructions that are executable by the processing device for causing the processing device to:

receive a user input involving removing an existing operation from the pipeline; and in response to receiving the user input:
remove the existing operation from the pipeline;
automatically remove at least one other operation from the pipeline, wherein the at least one other operation is an extraneous operation based on removing the existing operation from the pipeline; and
automatically update the graphical visualization of the pipeline to remove visual representations of the existing operation and the at least one other operation.

14. A method comprising:
accessing a pipeline for forecasting a plurality of time series, the pipeline representing a sequence of operations for processing the plurality of time series to produce forecasts, wherein the sequence of operations includes:
(i) model strategy operations for applying model strategies to the plurality of time series to determine error distributions corresponding to the model strategies, wherein each of the model strategies is configured to:
receive the plurality of time series;
determine champion forecasts for the plurality of time series by, for each time series among the plurality of time series:
generating respective forecasts for the time series by applying forecasting models to the time series; and
determining a respective champion forecast for the time series by comparing error metrics associated with the respective forecasts;
determine error values associated with the champion forecasts, each of the error values indicating the accuracy of a respective champion forecast among the champion forecasts; and
generate one of the error distributions using the error values; and
(ii) a model-strategy comparison operation configured to:
receive the error distributions corresponding to the model strategies;
determine aggregate error values associated with the model strategies based on the error distributions, each aggregate error value being associated with one of the model strategies and being determined by aggregating the error values in one of the error distributions; and
determine which of the model strategies is a champion model strategy for the plurality of time series by comparing the aggregate error values to one another; and
executing the pipeline to determine the champion model strategy for the plurality of time series.

15. The method of claim 14, wherein the model strategies are defined in shareable files to enable importation of the model strategies into another pipeline for execution.

16. The method of claim 14, wherein the pipeline is programmatically generated according to user preferences within a forecasting software environment.

17. The method of claim 14, wherein the pipeline includes:
a plurality of pipeline segments for executing a plurality of operation groups in parallel;
a segmentation operation prior to the plurality of pipeline segments for dividing the plurality of time series into a plurality of data segments, each data segment among the plurality of data segments being destined for a respective pipeline segment among the plurality of pipeline segments; and
a merge segment operation subsequent to the pipeline segments for combining results from the plurality of pipeline segments.

18. The method of claim 14, further comprising determining a champion pipeline for a project by comparing a first pipeline in the project to a second pipeline in the project.

19. The method of claim 18, further comprising:
determining the champion pipeline for the project by comparing (i) a first champion forecast generated by the first pipeline based on the plurality of time series, to (ii) a second champion forecast generated by the second pipeline based on the plurality of time series; and
including a graphical object in a graphical user interface to indicate that the first pipeline is the champion pipeline.

20. The method of claim 19, further comprising:
receiving an override instruction to use the second pipeline rather than the champion pipeline to forecast the plurality of time series; and
subsequent to receiving the override instruction, generating one or more forecasts for the plurality of time series using the second pipeline rather than the champion pipeline.

21. The method of claim 14, wherein:
the pipeline is defined in a file that is a shareable with other users and formatted to enable the other users to import the pipeline into a forecasting software environment and execute the pipeline;
accessing the pipeline comprises loading the file of the pipeline into the forecasting software environment; and
executing the pipeline comprises executing the pipeline in the forecasting software environment.

22. The method of claim 14, further comprising:
including a graphical visualization of the pipeline in a graphical user interface, the graphical visualization including visual representations of each operation among the sequence of operations spatially organized in an order in which the sequence of operations is executed in the pipeline.

23. The method of claim 22, wherein the graphical visualization includes a swim lane diagram with a series of distinct lanes spatially positioned adjacent to one another, the lanes including:
a first lane for depicting pre-processing operations;
a second lane for depicting model strategy operations;
a third lane for depicting comparison operations; and
a fourth lane for depicting post-processing operations,
wherein each lane has a visual representation of an operation in the pipeline connected to another visual representation of another operation in the pipeline depicted in another lane.

24. The method of claim 22, further comprising:
detecting a user input involving adding an operation to the pipeline; and
based on the user input, automatically adding another operation into the pipeline or remove the other operation from the pipeline in accordance with predefined rules.

25. The method of claim 24, wherein the operation is a model strategy operation, and further comprising:
automatically adding the other operation to the pipeline, the other operation being a required operation according to the predefined rules; and automatically updating the graphical visualization of the pipeline to include (i) a visual representation of the other operation, and (ii) a visual representation of the model strategy operation with a visual connection to another visual representation of at least one other operation among the sequence of operations.

26. The method of claim 22, further comprising:
receiving a user input involving removing an existing operation from the pipeline; and
in response to receiving the user input:
   removing the existing operation from the pipeline;
   automatically removing at least one other operation from the pipeline, wherein the at least one other operation is an extraneous operation based on removing the existing operation from the pipeline; and
   automatically updating the graphical visualization of the pipeline to remove visual representations of the existing operation and the at least one other operation.

27. A non-transitory computer-readable medium comprising instructions that are executable by a processing device for causing the processing device to:
access a pipeline for forecasting a plurality of time series, the pipeline representing a sequence of operations for processing the plurality of time series to produce forecasts, wherein the sequence of operations includes:
   (i) model strategy operations for applying model strategies to the plurality of time series to determine error distributions corresponding to the model strategies, wherein each of the model strategies is configured to:
      receive the plurality of time series;
      determine champion forecasts for the plurality of time series by, for each time series among the plurality of time series:
         generating respective forecasts for the time series by applying forecasting models to the time series; and
         determining a respective champion forecast for the time series by comparing error metrics associated with the respective forecasts;
      determine error values associated with the champion forecasts, each of the error values indicating the accuracy of a respective champion forecast among the champion forecasts; and
      generate one of the error distributions using the error values; and
   (ii) a model-strategy comparison operation configured to:
      receive the error distributions corresponding to the model strategies;
      determine aggregate error values associated with the model strategies based on the error distributions, each aggregate error value being associated with one of the model strategies and being determined by aggregating the error values in one of the error distributions; and
      determine which of the model strategies is a champion model strategy for the plurality of time series by comparing the aggregate error values to one another; and
   execute the pipeline to determine the champion model strategy for the plurality of time series.

28. The non-transitory computer-readable medium of claim 27, wherein the model strategies are defined in shareable files to enable importation of the model strategies into another pipeline for execution.

29. The non-transitory computer-readable medium of claim 27, wherein the pipeline is programmatically generated according to user preferences within a forecasting software environment.

30. The non-transitory computer-readable medium of claim 27, wherein the pipeline includes:
   a plurality of pipeline segments for executing a plurality of operation groups in parallel;
   a segmentation operation prior to the plurality of pipeline segments for dividing the plurality of time series into a plurality of data segments, each data segment among the plurality of data segments being destined for a respective pipeline segment among the plurality of pipeline segments; and
   a merge segment operation subsequent to the pipeline segments for combining results from the plurality of pipeline segments.

* * * * *